United States Patent
Park et al.

(10) Patent No.: US 12,022,700 B2
(45) Date of Patent: Jun. 25, 2024

(54) DISPLAY DEVICE AND METHOD OF MANUFACTURING THE SAME

(71) Applicant: Samsung Display Co., LTD., Yongin-si (KR)

(72) Inventors: Chan Jae Park, Suwon-si (KR); Atsushi Nemoto, Suwon-si (KR); Tae Ho Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 456 days.

(21) Appl. No.: 17/400,819

(22) Filed: Aug. 12, 2021

(65) Prior Publication Data

US 2022/0059640 A1   Feb. 24, 2022

(30) Foreign Application Priority Data

Aug. 21, 2020   (KR) .................. 10-2020-0105195

(51) Int. Cl.
*H10K 59/131* (2023.01)
*H10K 71/00* (2023.01)
*H10K 59/12* (2023.01)

(52) U.S. Cl.
CPC ........... *H10K 59/131* (2023.02); *H10K 71/00* (2023.02); *H10K 59/1201* (2023.02)

(58) Field of Classification Search
CPC ................................................... H10K 59/131
See application file for complete search history.

(56) References Cited

U.S. PATENT DOCUMENTS 8,748,226 B2 * 6/2014 Liu .................. H01L 24/83
257/676

FOREIGN PATENT DOCUMENTS

| KR | 10-1189682 | 10/2012 |
| KR | 10-2016-0068850 | 6/2016 |
| KR | 10-1849117 | 4/2018 |

* cited by examiner

*Primary Examiner* — Douglas M Menz
(74) *Attorney, Agent, or Firm* — KILE PARK REED & HOUTTEMAN PLLC

(57) ABSTRACT

A display device includes a substrate; pad electrodes disposed on the substrate and spaced apart from one another; a driving member including bumps, which overlap the pad electrodes in a thickness direction of the substrate and are spaced apart from one another; conductive members disposed between the pad electrodes and the bumps to electrically connect the pad electrodes and the bumps; and non-conductive members disposed adjacent to the pad electrodes, the bumps, and the conductive members, wherein the conductive members and the non-conductive members include different materials, each of the conductive members includes a first side surface that faces a corresponding one of the non-conductive members, each of the non-conductive members include a second side surface that faces a corresponding one of the conductive members, and a part of the first side surface and a part of the second side surface directly contact one another.

16 Claims, 32 Drawing Sheets

FIG. 4
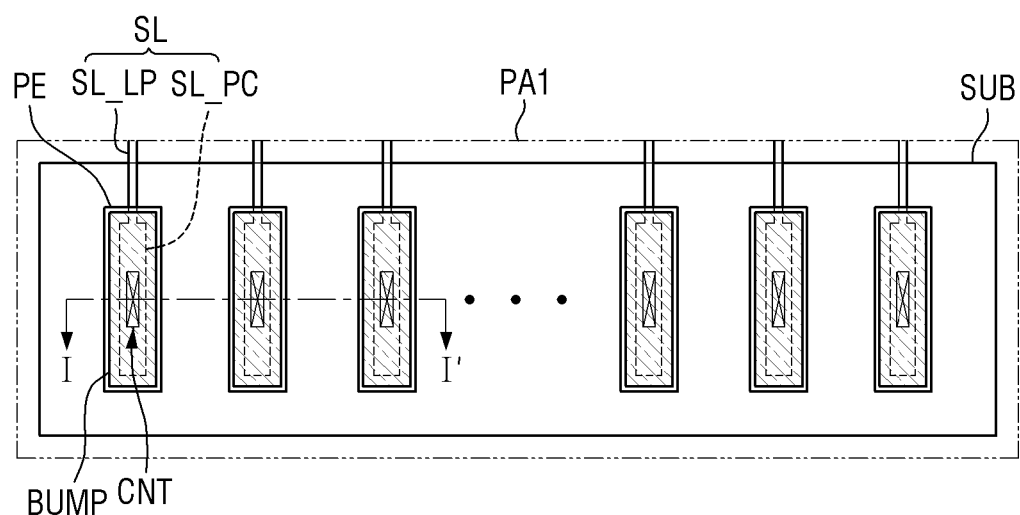
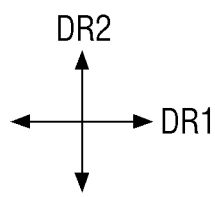

FIG. 5
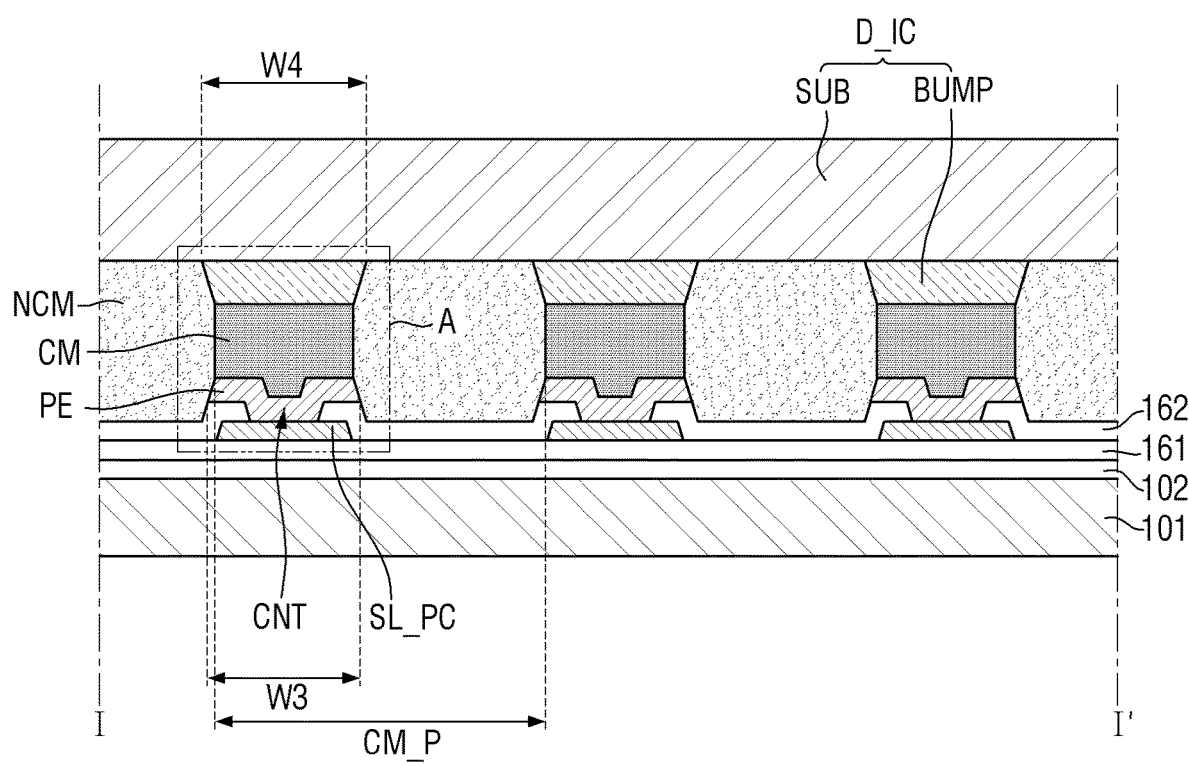
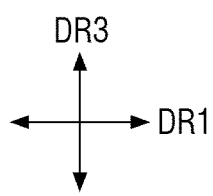

FIG. 11
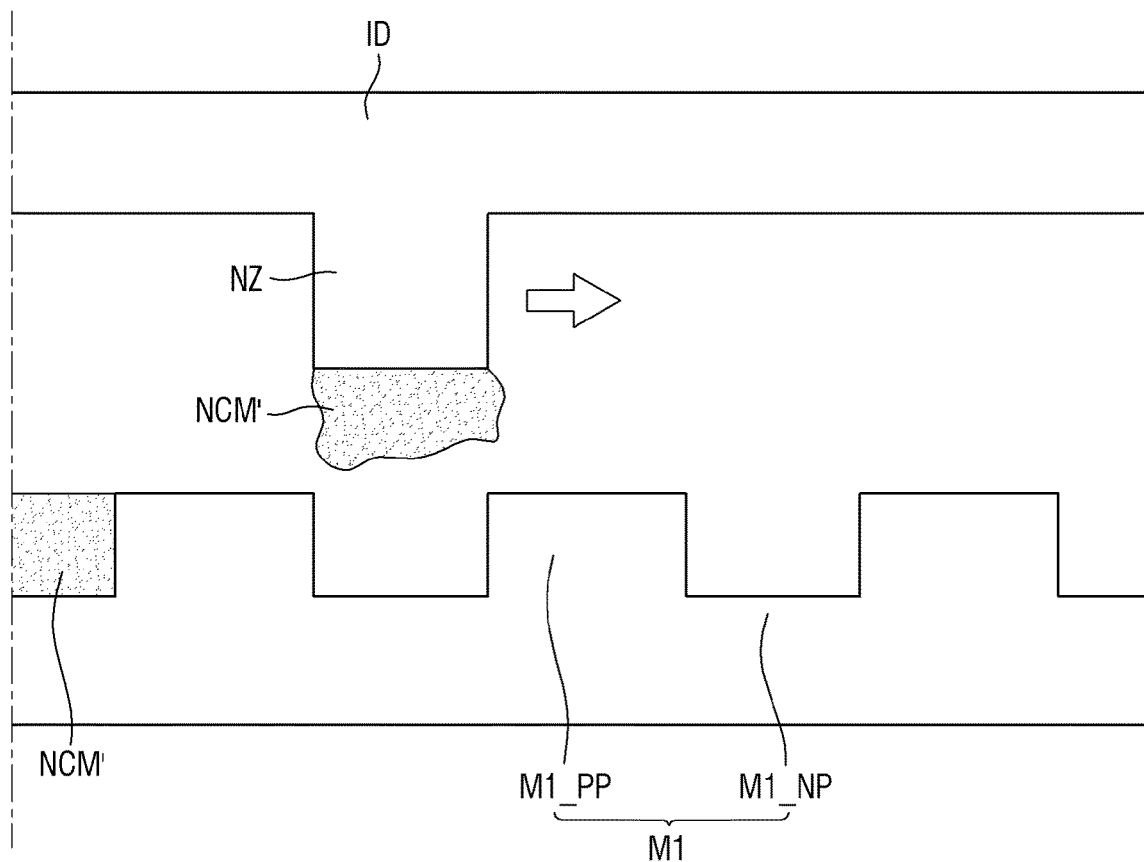
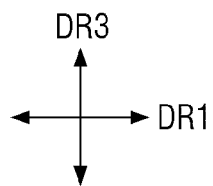

FIG. 18
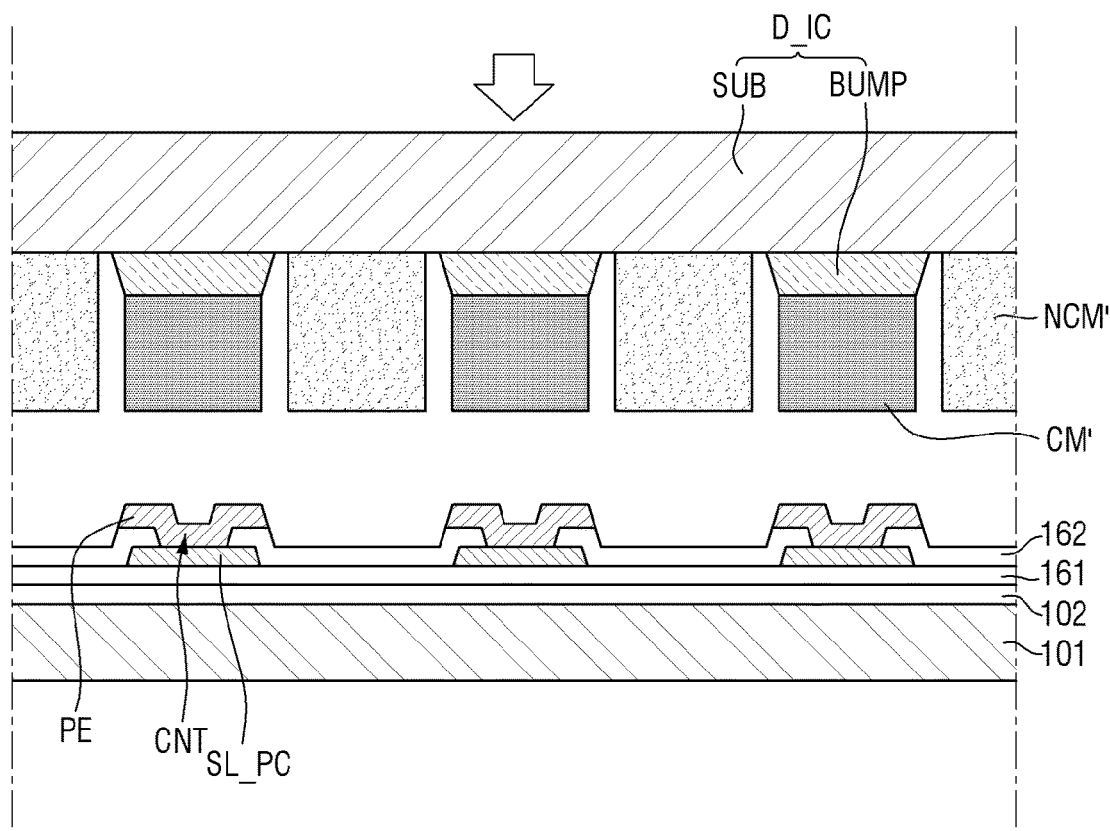
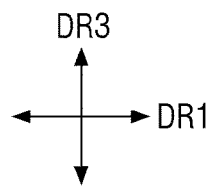

FIG. 23
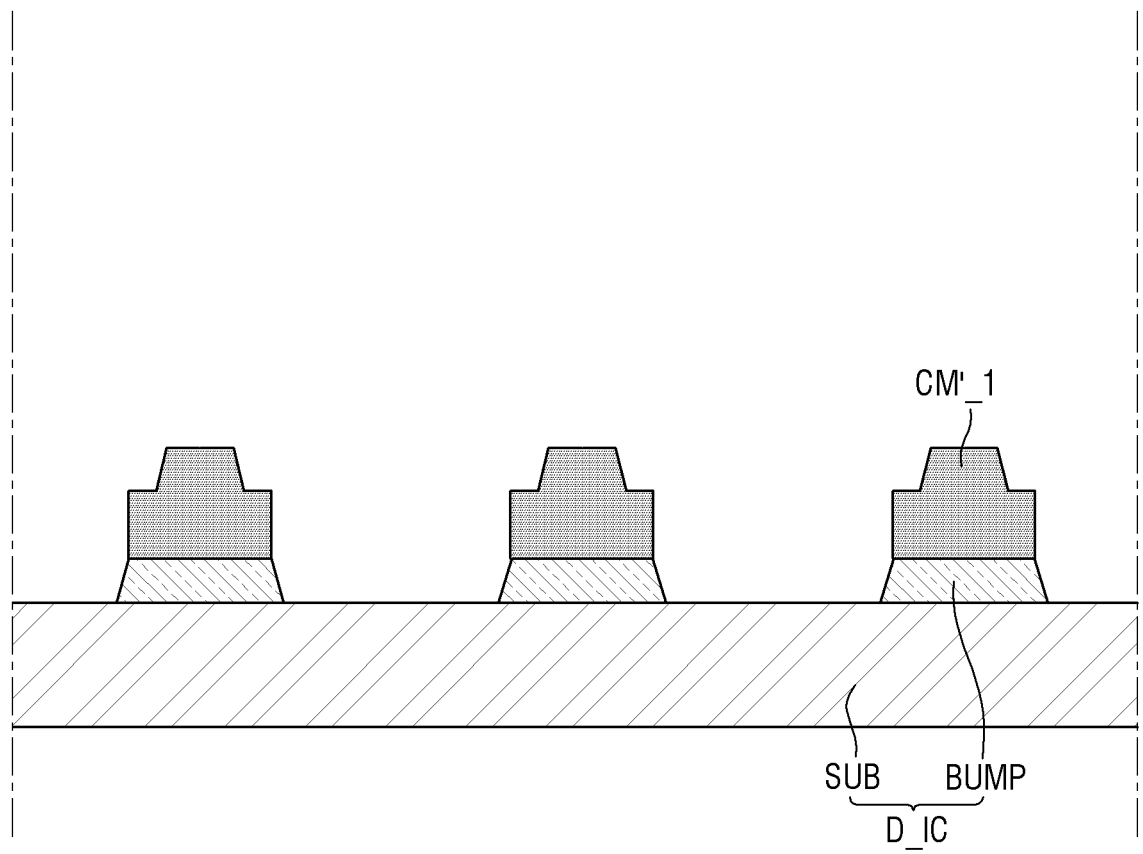
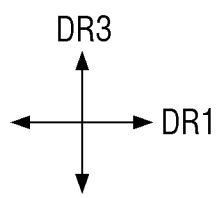

FIG. 25
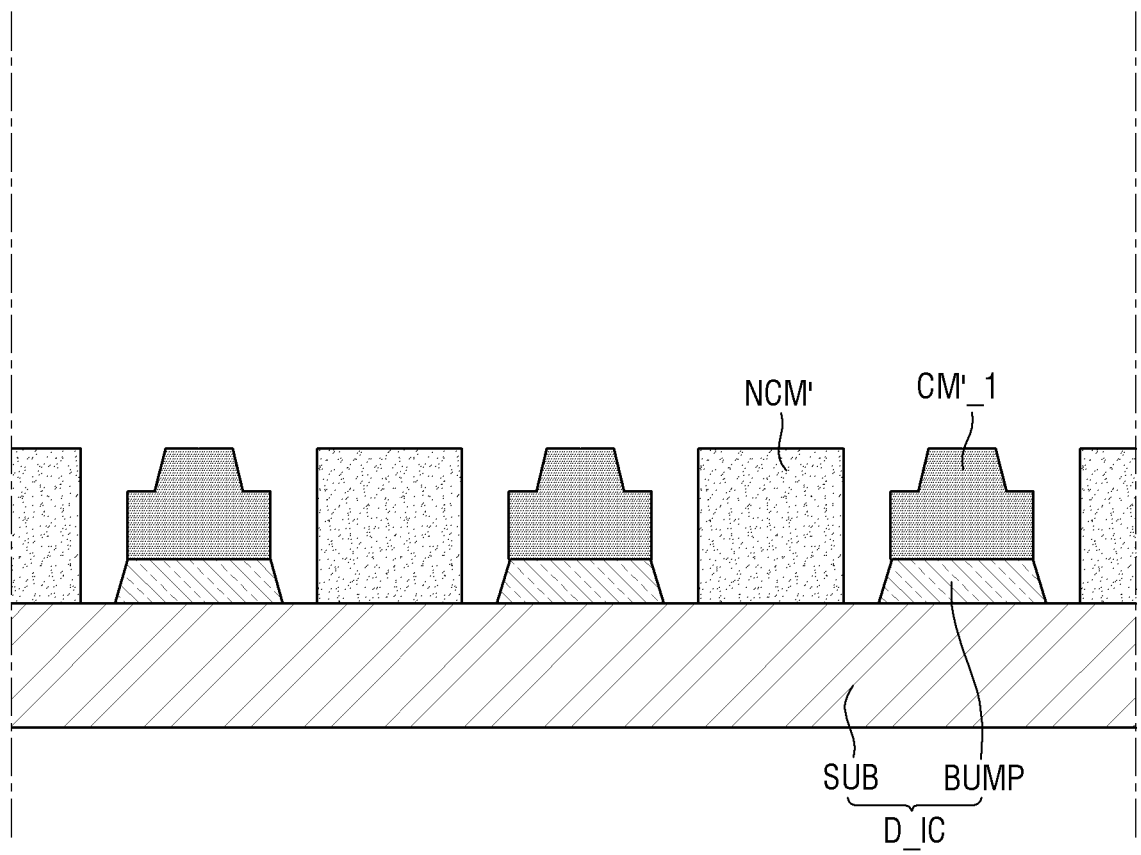
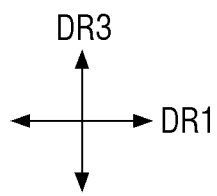

FIG. 32
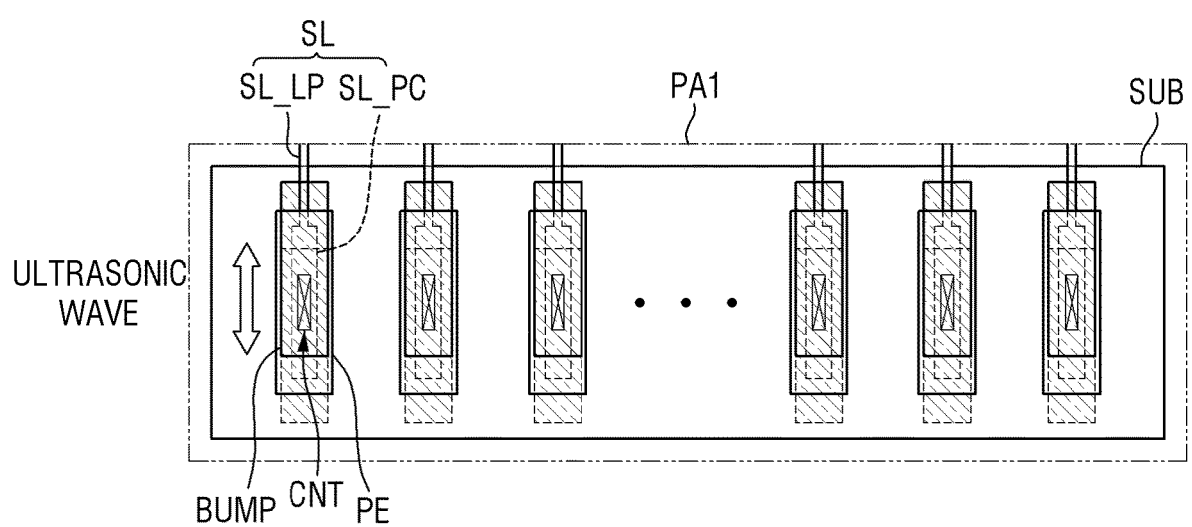
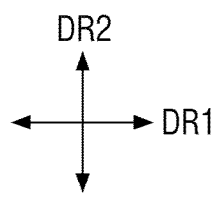

DISPLAY DEVICE AND METHOD OF MANUFACTURING THE SAME

CROSS-REFERENCE TO RELATED APPLICATION(S)

This application claims priority to and the benefit of Korean Patent Application No. 10-2020-0105195 under 35 U.S.C. § 119, filed in the Korean Intellectual Property Office (KIPO) on Aug. 21, 2020, the entire contents of which are incorporated herein by reference.

BACKGROUND

1. Technical Field

The disclosure relates to a display device and a method of manufacturing the same.

2. Description of the Related Art

A display device is a device that visually displays data. The display device can be used not only in a portable electronic device such as a mobile phone, a smartphone, a tablet personal computer (PC), a smartwatch, a watchphone, a mobile communication terminal, an electronic notepad, an electronic book reader, a portable multimedia player (PMP), a navigation device, or an ultra-mobile PC (UMPC), but also in various other products such as a television (TV), a laptop computer, a monitor, a billboard, or an Internet-of-Things (IoT) device, as display screen.

The display device may include a substrate that is divided into a display area and a non-display area. Pixels are disposed in the display area, and pads are disposed in the non-display area. Driving circuits may be mounted on the pads and may transmit driving signals to the pixels.

A typical driving circuit includes bumps, and the bumps may be electrically connected to separate pads. The bumps and the pads may be indirectly connected via conductive members or may be directly connected. Each of the conductive members may be, for example, an anisotropic conductive film (ACF) including an adhesive resin and conductive balls dispersed in the adhesive resin. The bumps and the pads may be short- or open-circuited depending on the locations of the conductive balls in the ACF.

Particularly, a high-resolution display device having a pad/bump arrangement with a considerably-reduced pitch is highly susceptible to such errors as a short circuit or an open circuit.

SUMMARY

Embodiments of the disclosure provide a display device capable of preventing a short circuit or an open circuit between a driving circuit and pads in a high-resolution pitch configuration.

Embodiments of the disclosure also provide a method of manufacturing a display device capable of preventing a short circuit or an open circuit between a driving circuit and pads in a high-resolution pitch configuration.

However, embodiments of the disclosure are not restricted to those set forth herein. The above and other embodiments of the disclosure will become more apparent to one of ordinary skill in the art to which the disclosure pertains by referencing the detailed description of the disclosure given below.

According to an embodiment of the disclosure, a display device may include a substrate; a plurality of pad electrodes disposed on the substrate and spaced apart from one another; a driving member including a plurality of bumps, which overlap the plurality of pad electrodes in a thickness direction of the substrate and are spaced apart from one another; conductive members disposed between the plurality of pad electrodes and the plurality of bumps, which overlap the plurality of pad electrodes, to electrically connect the plurality of pad electrodes and the plurality of bumps; and non-conductive members disposed adjacent to the plurality of pad electrodes, the plurality of bumps, and the conductive members, wherein the conductive members and the non-conductive members include different materials, each of the conductive members includes a first side surface that faces a corresponding one of the non-conductive members, each of the non-conductive members include a second side surface that faces a corresponding one of the conductive members, and a part of the first side surface and a part of the second side surface directly contact one another.

A part of the first side surface and a part of the second side surface may be spaced apart by an air gap.

The conductive members may be spaced apart from one another in a direction in which the plurality of pad electrodes are arranged.

The conductive members may directly contact bottom surfaces of the plurality of bumps and top surfaces of the plurality of pad electrodes. A width of each of the plurality of pad electrodes may be equal to a width of each of the plurality of bumps. In a plan view, a length of a part of each of the conductive members contacting a corresponding one of the top surfaces of the plurality of pad electrodes may be equal to a length of a part of each of the conductive members contacting a corresponding one of the bottom surfaces of the plurality of bumps.

A width of each of the conductive members may be equal to a width of each of the top surfaces of the plurality of pad electrodes and a width of each of the bottom surfaces of the plurality of bumps.

The non-conductive members may not contact the bottom surfaces of the plurality of bumps or the top surfaces of the plurality of pad electrodes.

Each of the conductive members may be symmetrical with respect to a reference line that equally divides a corresponding one of the conductive members in the thickness direction of the substrate, between a reference plane of each of the top surfaces of the plurality of pad electrodes and a reference plane of each of the bottom surfaces of the plurality of bumps.

The first side surfaces of the conductive members may be outwardly convex. A width, along the reference line, of each of the conductive members may be greater than a length, in a plan view, of the part of the each of the conductive members contacting a corresponding one of the plurality of pad electrodes.

The conductive members may directly contact the bottom surfaces of the plurality of bumps and the top surfaces of the plurality of pad electrodes. A width of each of the plurality of pad electrodes may be equal to a width of each of the plurality of bumps. In a plan view, a length of a part of each of the conductive members contacting a corresponding one of the top surfaces of the plurality of pad electrodes may be greater than a length of a part of each of the conductive members contacting a corresponding one of the bottom surfaces of the plurality of bumps.

The conductive members may be asymmetrical with respect to a reference line that equally divides a corresponding one of the conductive members in the thickness direction of the substrate, between a reference plane of each of the top surfaces of the plurality of pad electrodes and a reference plane of each of the bottom surfaces of the plurality of bumps.

The conductive members may expose parts of the bottom surfaces of the plurality of bumps. The non-conductive members may directly contact the exposed parts of the bottom surfaces of the plurality of bumps.

Each of the conductive members may include a conductive paste, and each of the non-conductive members may include an insulating resin.

The display device may further include pad contact parts disposed under the plurality of pad electrodes; and an interlayer insulating layer disposed between each of the pad contact parts and each of the plurality of pad electrodes, the interlayer insulating layer including contact holes. Each of the contact holes may expose a part of a corresponding one of top surfaces of the pad contact parts, and the plurality of pad electrodes may be electrically connected to the pad contact parts through the contact holes.

A width of each of the plurality of pad electrodes may be greater than a width of each of the pad contact parts.

The driving member may include a driving chip or a printed circuit film, and the plurality of pad electrodes may receive driving signals from the driving member and transmit the driving signals to the pad contact parts.

Each of the non-conductive members may directly contact a corresponding one of a top surface of the interlayer insulating layer.

According to another embodiment of the disclosure, a method of manufacturing a display device may include forming non-conductive materials on a first substrate on which a plurality of first electrodes are spaced apart from one another, between the plurality of first electrodes; forming conductive materials in areas that overlap the plurality of first electrodes; disposing a second substrate including a plurality of second electrodes on the first substrate; and electrically connecting the plurality of first electrodes and the plurality of second electrodes by the conductive materials, wherein the conductive materials and the non-conductive materials may include different materials.

The forming of the non-conductive materials may include performing a gravure printing or an inkjet printing, and the performing of the gravure printing may include filling depressed parts of a first mold, in which the depressed parts and embossed parts are repeatedly arranged and are physically connected, with the non-conductive materials; and transferring the non-conductive materials from the depressed parts of the first mold to gaps between the plurality of first electrodes.

The forming of the non-conductive materials may include performing an embossed printing, and the performing of the embossed printing may include forming the conductive materials on embossed parts of a second mold, in which depressed parts and the embossed parts are repeatedly arranged and are physically connected, and transferring the conductive materials from the embossed parts of the second mold onto the plurality of first electrodes to overlap the plurality of first electrodes.

According to another embodiment of the disclosure, a method of manufacturing a display device may include forming non-conductive materials on a substrate, on which a plurality of pad electrodes are spaced apart from one another, between the plurality of pad electrodes; disposed a driving member including a plurality of bumps on the substrate, and bonding the plurality of pad electrodes and the plurality of bumps by ultrasonic bonding.

According to the aforementioned and other embodiments of the disclosure, a short circuit or an open circuit can be prevented between a driving circuit and pads in a high-resolution pitch configuration.

Other features and embodiments may be apparent from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which:

FIG. 4 is a schematic layout view illustrating how the pads and the bumps disposed in the first pad area of the display device of FIG. 1 are connected;

FIG. 5 is a schematic cross-sectional view taken along line I-F of FIG. 4;

FIG. 11 is a schematic cross-sectional view illustrating how to form non-conductive materials via inkjet printing;

FIGS. 17 and 18 are schematic cross-sectional views illustrating a method of manufacturing a display device according to another embodiment of the disclosure;

FIGS. 22 and 23 are schematic cross-sectional views illustrating a method of manufacturing a display device according to another embodiment of the disclosure;

FIGS. 24 and 25 are schematic cross-sectional views illustrating a method of manufacturing a display device according to another embodiment of the disclosure;

FIGS. 28 through 32 are schematic cross-sectional views illustrating a method of manufacturing a display device according to another embodiment of the disclosure.

DETAILED DESCRIPTION OF THE EMBODIMENTS

Figure 1:
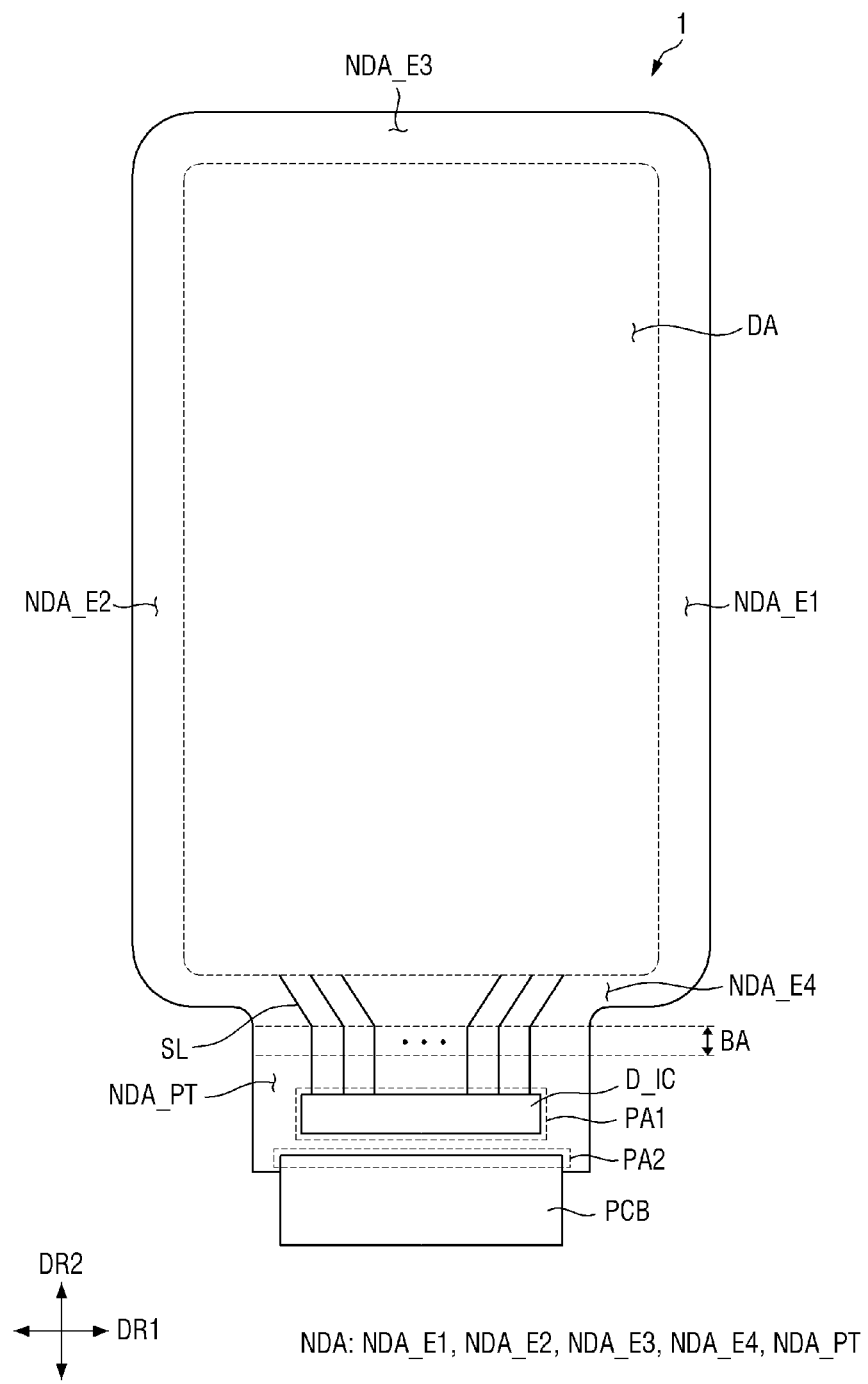
FIG. 1 is a schematic plan view of a display device according to an embodiment of the disclosure.

Specific structural and functional descriptions of embodiments of the disclosure disclosed herein are only for illustrative purposes of the embodiments of the disclosure. The disclosure may be embodied in many different forms without departing from the spirit and significant characteristics of the disclosure. Therefore, the embodiments of the disclosure are disclosed only for illustrative purposes and should not be construed as limiting the disclosure.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third," and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity and are intended to include both the singular and plural, unless the context clearly indicates otherwise. For example, "an element" has the same meaning as "at least one element," unless the context clearly indicates otherwise. The term "at least one" is not to be construed as limiting "a" or "an." The term "or" may mean "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower" can therefore encompass both an orientation of "lower" and "upper" depending on the particular orientation of the figure. Similarly, if the device in one of the figures is turned over, elements described as "below" or "beneath" other elements would then be oriented "above" the other elements. The exemplary terms "below" or "beneath" can therefore encompass both an orientation of above and below.

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and will not be interpreted in an ideal or excessively formal sense unless clearly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the disclosure will be described with reference to the attached drawings.

FIG. 1 is a schematic plan view of a display device according to an embodiment.

Referring to FIG. 1, a display device 1 may include a display area DA, which includes pixels and displays an image, and a non-display area NDA, which is disposed around the display area DA. The display area DA of the display device 1 may have a rectangular shape with rounded corners in a plan view. The display area DA may have four rounded corners, two long sides, and two short sides.

First and second directions DR1 and DR2 may be different directions that intersect each other. FIG. 1 illustrates that horizontal and vertical directions are the first and second directions DR1 and DR2, respectively. In a plan view, the first direction DR1 may include a rightward direction and a leftward direction, and the second direction DR2 may include an upward direction and a downward direction. However, the first and second directions DR1 and DR2 may be relative directions, and the disclosure is not limited thereto.

The long sides of the display area DA may extend in the second direction DR2, and the short sides of the display area DA may extend in the first direction DR1.

The non-display area NDA may completely surround the long sides, the short sides, and the four corners of the display area DA in a plan view. As illustrated in FIG. 1, in a plan view, the non-display area NDA may have the shape of a rectangular frame substantially surrounding the display area DA. For example, the non-display area NDA may include a first edge part NDA_E1, which is adjacent to the long side of the display area DA on a first side in the first direction DR1 and extends in the second direction DR2, a second edge part NDA_E2, which is adjacent to the long side of the display area DA on a second side in the first direction DR1 and extends in the second direction DR2, a third edge part NDA_E3, which is adjacent to the short side of the display area DA on a first side in the second direction DR2 and extends in the first direction DR1, and a fourth edge part NDA_E4, which is adjacent to the short side of the display area DA on a second side in the second direction DR2.

The non-display area NDA may further include a protruding part NDA_PT, which protrudes from the fourth edge part NDA_E4 toward a second side in the second direction DR2, of the non-display area NDA. The protruding part NDA_PT of the non-display area NDA may have a smaller width than the fourth edge part NDA_E4 in the first direction DR1. For example, the protruding part NDA_PT of the non-display area NDA may protrude from the center of the fourth edge part NDA_E4, which is spaced apart from the first and second edge parts NDA_E1 and NDA_E2. L-shaped cuts may be defined between the protruding part NDA_PT and the first and second edge parts NDA_E1 and NDA_E2 of the non-display area NDA.

The protruding part NDA_PT of the non-display area NDA may include a bending area BA, which extends in the first direction DR1 and has a predetermined width in the second direction DR2. The display device 1 may be bent or folded in the bending area BA.

The protruding part NDA_PT of the non-display area NDA may further include pad areas (PA1 and PA2). Multiple pads may be disposed in the pad areas (PA1 and PA2). The pad areas (PA1 and PA2) may include a first pad area PA1, which is disposed relatively adjacent to the bending area BA, and a second pad area PA2, which is disposed relatively adjacent to the end of the protruding part NDA_PT. The first and second pad areas PA1 and PA2 may be spaced apart from each other in the second direction DR2.

The display device 1 may further include a driving member D_IC and a printed circuit board PCB. The driving member D_IC may be disposed (in a chip-on-plastic manner) to overlap the first pad area PA1 of the protruding part NDA_PT, and the printed circuit board PCB may be disposed to overlap the second pad area PA2 of the protruding part NDA_PT. The driving member D_IC may be electrically connected to pads disposed in the first pad area PA1, and the printed circuit board PCB may be electrically connected to pads disposed in the second pad area PA2 of the protruding part NDA_PT.

The pads in the first pad area PA1 that are electrically connected to the driving member D_IC may be electrically connected to signal lines SL. The signal lines SL, which are electrically connected to the pads in the first pad area PA1, may extend toward the display area DA. The signal lines SL may be electrically connected to pixels in the display area DA. Although not specifically illustrated, wires or lines that electrically connect the first and second pad areas PA1 and PA2 may be disposed between the first and second pad areas PA1 and PA2.

In some embodiments, the driving member D_IC may be mounted on a flexible printed circuit film attached to the second pad area PA2 (in a chip-on-film manner), instead of being disposed in the first pad area PA1 of the protruding part NDA_PT. A side of the flexible printed circuit film may be attached to the second pad area PA2, and the other side of the flexible printed circuit film may be attached to the printed circuit board PCB. Leads to be electrically connected to the pads in the second pad area PA2 may be provided on a surface of the flexible printed circuit film that faces the second pad area PA2. Unless specified otherwise, the relationships between the bumps, pads, conductive members, and non-conductive members of the driving member D_IC may be directly applicable to the relationships between the leads, pads, conductive members, and non-conductive members of the flexible printed circuit film. The driving member D_IC will hereinafter be described as being attached to the first pad area PA1 in, for example, a chip-on-plastic manner.

Figure 2:
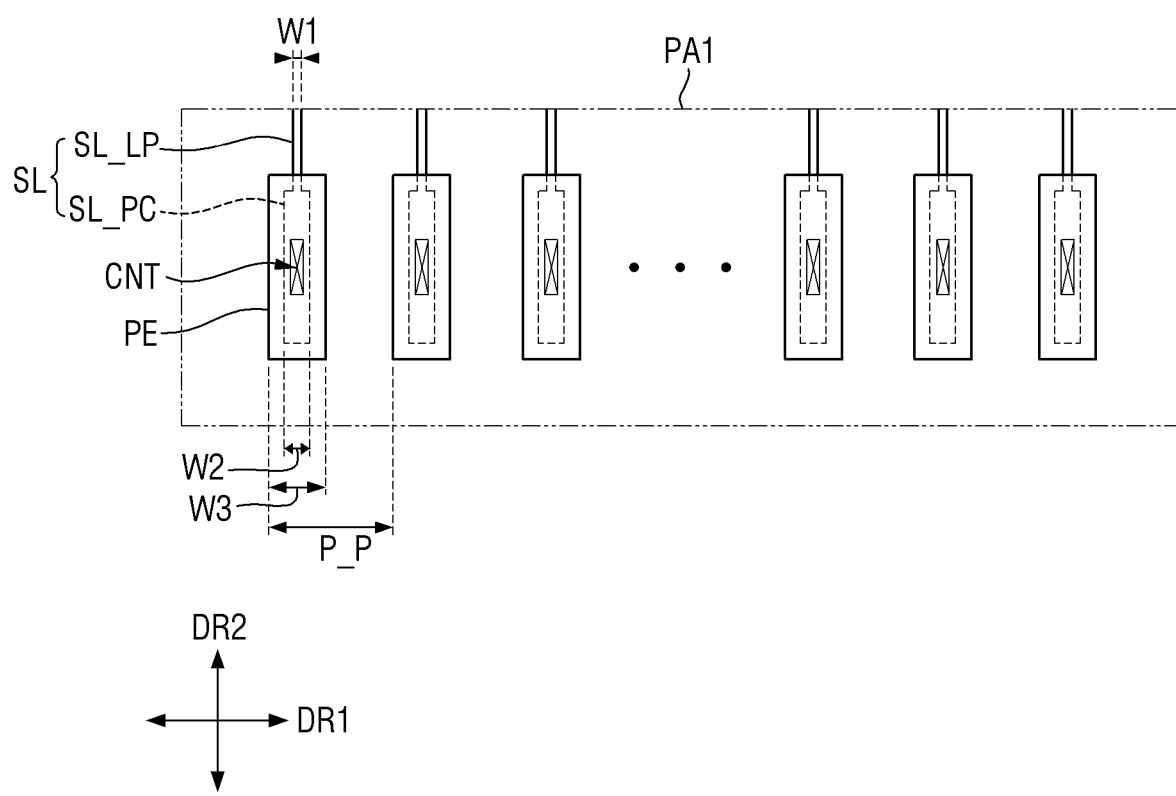
FIG. 2 is a schematic layout view illustrating pads disposed in a first pad area of the display device of FIG. 1.
Figure 3:
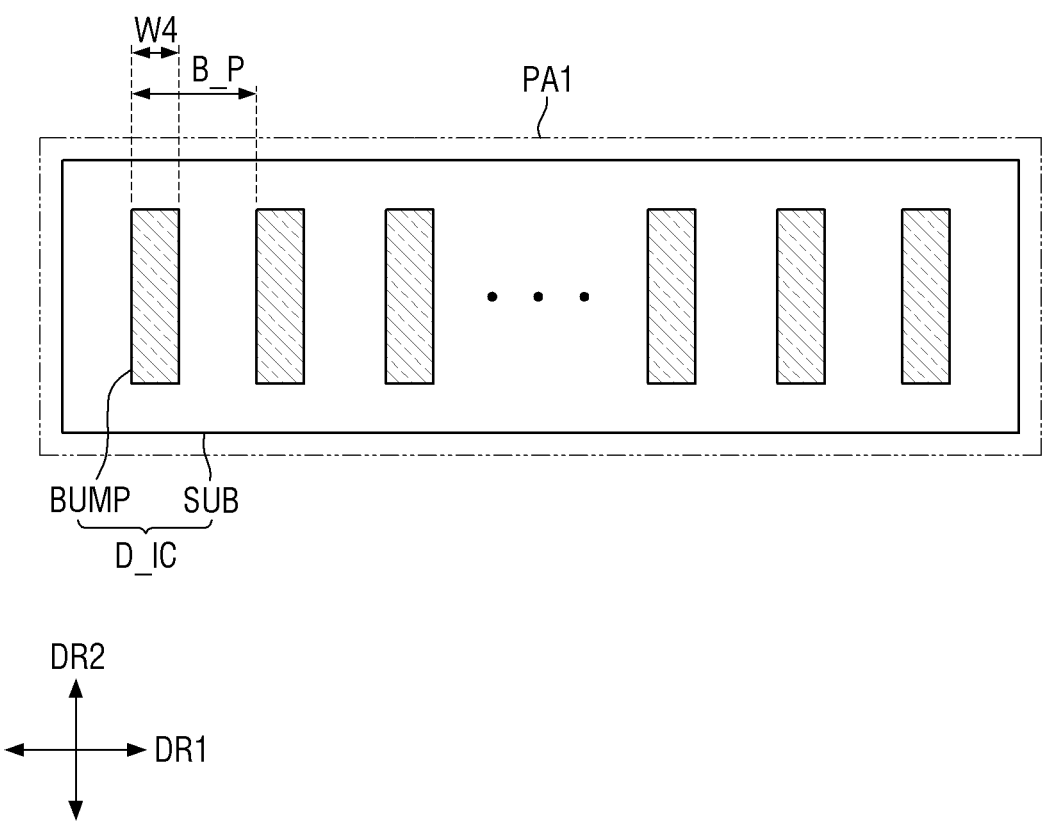
FIG. 3 is a schematic layout view of bumps disposed in the first pad area of the display device of FIG. 1.

FIG. 2 is a schematic layout view illustrating the pads disposed in the first pad area PA1 of the display device of FIG. 1. FIG. 3 is a schematic layout view of the bumps disposed in the first pad area PA1 of the display device of FIG. 1. FIG. 4 is a schematic layout view illustrating how the pads and the bumps disposed in the first pad area of the display device of FIG. 1 may be connected.

Referring to FIGS. 2 through 4, the signal lines SL may include line parts SL_LP, which are electrically connected to the pixels and extend to the first pad area PA1, and pad contact parts SL_PC, which are electrically connected to the line parts SL_LP and have an expanded width in the first direction DR1, as compared to the line parts SL_LP. A width W1 of the line parts SL_LP in the first direction DR1 may be smaller than a width W2 of the pad contact parts SL_PC in the first direction DR1. An insulating layer may be disposed on the signal lines SL and may include one or more contact holes CNT that expose the top surfaces of the pad contact parts SL_PC. Pad electrodes PE may be disposed on the insulating layer. The pad electrodes PE may be electrically connected to the pad contact parts SL_PC via the contact holes CNT and may overlap the pad contact parts SL_PC in a thickness direction. The pads described above with reference to FIG. 1 may include the pad contact parts SL_PC and the pad electrodes PE. The pad electrodes PE may have a larger size than the pad contact parts SL_PC in a plan view. For example, a width W3 of the pad electrodes PE in the first direction DR1 may be greater than the width W2 of the pad contact parts SL_PC in the first direction DR1. The pad electrodes PE may completely cover or overlap the pad contact parts SL_PC in a plan view.

Although not specifically illustrated in FIG. 2, the pads in the first pad area PA1 may be divided into input pads that receive signals from the printed circuit board PCB of FIG. 1 and output pads that transmit signals output from the driving member D_IC to the pixels in the display area DA via the signal lines SL. The input pads and the output pads may be arranged in the first direction DR1. The input pads and the output pads may be arranged in different columns. The output pads will hereinafter be referred simply as pads if there is no need to differentiate the output pads from input pads PAD_I.

Multiple pads may be arranged in the first direction DR1 at a uniform pitch, for example, a pitch P_P. The pads may be arranged at a high density to implement a high-resolution configuration. The pitch P_P may be about 20 μm, but the disclosure is not limited thereto.

The driving member D_IC, which include bumps BUMP disposed in the first pad area PA1 and a substrate (or a driving substrate) SUB where the bumps BUMP are disposed, will hereinafter be described with reference to FIG. 3.

The driving member D_IC may include the substrate SUB and bumps BUMP on the substrate SUB. The substrate SUB may include a driving circuit for generating driving signals. The driving signals may include data signals, power supply signals, control signals, and/or gate signals. The driving signals generated by the substrate SUB may be provided to the pads via the bumps BUMP.

The bumps BUMP may be arranged in the first direction DR1 at a uniform pitch, i.e., a pitch B_P. The pitch B_P may be equal to the pitch P_P.

A width W4 of the bumps BUMP in the first direction DR1 may be equal to the width W3 of the pad electrodes PE in the first direction DR1. The bumps BUMP may have a size equal to or smaller than that of the pad electrodes PE in a plan view.

In case that the bumps BUMP and the pad electrodes PE have the same size in a plan view, the length of the bumps BUMP and the length of the pad electrodes PE in the second direction DR2 may be the same, and the pad electrodes PE and the bumps BUMP may be completely aligned in both the first and second directions DR1 and DR2. In other words, in case that the pad electrodes PE and the bumps BUMP are properly aligned, the pad electrodes PE and the bumps BUMP may completely overlap. In case that the bumps BUMP and the pad electrodes PE have the same size in a plan view, the contact areas of the bumps BUMP and the pad electrodes PE may increase, and as a result, the resistance between the bumps BUMP and the pad electrodes PE may decrease.

In case that the bumps BUMP have a smaller size than the pad electrodes PE in a plan view, the length of the bumps BUMP in the second direction DR2 may be smaller than the length of the pad electrodes PE in the second direction DR2. In case that the bumps BUMP and the pad electrodes PE are properly aligned, the distance between first short sides of the bumps BUMP in the second direction DR2 and first short sides of the pad electrodes PE in the second direction DR2 may be equal to the distance between second short sides of the bumps BUMP in the second direction DR2 and second short sides of the pad electrodes PE in the second direction DR2, and the distance between first long sides of the bumps BUMP in the first direction DR1 and first long sides of the pad electrodes PE in the first direction DR1 may be equal to the distance between second long sides of the bumps BUMP in the first direction DR1 and second long sides of the pad electrodes PE in the first direction DR1. In case that the bumps BUMP have a smaller size than the pad electrodes PE in a plan view and have a smaller length than the pad electrodes PE in the second direction DR2, the bumps BUMP may be readily relocated into the pad electrode PE, even if alignment error occurs in the second direction DR2 in the process of bonding the bumps BUMP and the pad electrodes PE. As a result, the bonding area and the resistance between the bumps BUMP and the pad electrodes PE may be properly maintained, and thus reliability may be secured in terms of bonding area and resistance.

The bumps BUMP and the pad electrodes PE may be electrically connected to each other. The bumps BUMP and the pad electrodes PE may be electrically connected via conductive members CM (see FIG. 5).

FIG. 5 is a schematic cross-sectional view taken along line I-I' of FIG. 4.

Referring to FIG. 5, the display device 1 may include a substrate (or base substrate) 101, conductive patterns, insulating layers, and an organic light-emitting layer, and the conductive patterns, the insulating layers, and the organic light-emitting layer are disposed on the base substrate 101. FIG. 5 illustrates pad contact parts SL_PC and pad electrodes PE among the conductive patterns and a buffer layer 102, a first insulating layer 161, and a second insulating layer 162 among the insulating layers. The base substrate 101, the buffer layer 102, the first insulating layer 161, and the second insulating layer 162 will be described below in detail with reference to FIG. 7, and instead, it will hereinafter be described how and in what structure the base substrate 101, the buffer layer 102, the first insulating layer 161, and the second insulating layer 162 are stacked.

The buffer layer 102 may be disposed on the base substrate 101, and the first insulating layer 161 may be disposed on the buffer layer 102.

Pad contact parts SL_PC may be disposed on the first insulating layer 161. The pad contact parts SL_PC may be arranged to be spaced apart from one another in the direction in which the pad electrodes PE are arranged. The pad contact parts SL_PC may be disposed to overlap the pad electrodes PE in the thickness direction.

The second insulating layer 162 may be disposed on the pad contact parts SL_PC to cover or overlap the pad contact parts SL_PC and may include contact holes CNT, which partially expose the top surfaces of the pad contact parts SL_PC. The pad electrodes PE, which are disposed on the second insulating layer 162, may directly contact and be electrically connected to the pad contact parts SL_PC through the contact holes CNT. The width W3 of the pad electrodes PE may be greater than the width W2 of the pad contact parts SL_PC so that the pad electrodes PE may completely cover or overlap the pad contact parts SL_PC. The driving member D_IC may be disposed on the pad electrodes PE and on the second insulating layer 162. Bumps BUMP may be disposed on a surface of the substrate SUB that faces the base substrate 101. The bumps BUMP may be disposed to overlap the pad electrodes PE in the thickness direction.

Conductive members CM may be disposed between the bumps BUMP or between the pad electrodes PE, which overlap the bumps BUMP in the thickness direction. The conductive members CM may be interposed between the bumps BUMP or between the pad electrodes PE. As the conductive members CM are disposed between the bumps BUMP and between the pad electrodes PE, which overlap the bumps BUMP in the thickness direction, the conductive members CM may be disposed to be spaced apart from one another in the direction in which the pad electrodes PE are arranged. The conductive members CM may not be disposed in the gaps between the pad electrodes PE or between the bumps BUMP.

Since the pad electrodes PE and the bumps BUMP may be arranged in the first direction DR1 at a uniform pitch, for example, the pitch P_P or B_P, and the conductive members CM may not be disposed in the gaps between the bumps BUMP or between the pad electrodes PE, which overlap the bumps BUMP in the thickness direction, the conductive members CM may also be arranged at a uniform pitch, i.e., a pitch CM_P. The pitch CM_P may be equal to the pitches P_P and B_P.

Since the conductive members CM may be disposed only in regions where the pad electrodes PE and the bumps BUMP overlap each other, but not in the gaps between the pad electrodes PE or in the gaps between the bumps BUMP, the pad electrodes PE may be prevented from being short-circuited with neighboring bumps BUMP, and the bumps BUMP may be prevented from being short-circuited with neighboring pad electrodes PE. Sine the conductive members CM are disposed only between the pad electrodes PE or between the bumps BUMP, which overlap the pad electrodes PE in the thickness direction, the pad electrodes PE may be prevented from being open-circuited with their respective overlapping bumps BUMP. Accordingly, the conductive members CM may secure the reliability of the electrical connections between the pad electrodes PE and the bumps BUMP.

The conductive members CM may include a material that may be cured by heat and may bond the pad electrodes PE and the bumps BUMP, which are adjacent to each other. Examples of the material may include a metal paste including a thermally-cured adhesive resin and conductive powder scattered in the adhesive resin. Before being cured, the metal paste includes an adhesive resin dissolved in a solvent and metal powder having conductivity. Once the metal paste is cured by, for example, heat, the solvent is removed so that only the adhesive resin and the metal powder remain. Examples of the metal powder may include gold powder, silver powder, or aluminum powder.

The display device 1 may further include non-conductive members NCM, which are disposed near the pad electrodes PE, the bumps BUMP, and the conductive members CM. The material of the non-conductive members NCM may differ from that of the conductive members CM. The non-conductive members NCM, unlike the conductive members CM, may exhibit non-conductivity. The non-conductive members NCM may include a material having non-conductivity and capable of bonding adjacent elements by being cured by, for example, heat. Examples of the material of the non-conductive members NCM include a non-conductive adhesive resin.

The non-conductive members NCM may face parts of a surface of the substrate SUB that are exposed by the bumps BUMP and face the base substrate 101, side surfaces of each of the bumps BUMP, side surfaces of each of the conductive members CM, side surfaces of each of the pad electrodes PE, and parts of the second insulating layer 162 that are exposed by the pad electrodes PE and face the substrate SUB. The non-conductive members NCM may be disposed in the gaps between the bumps BUMP or between the pad electrodes PE and may thus prevent the pad electrodes PE from being short-circuited with neighboring bumps BUMP or the bumps BUMP from being short-circuited with neighboring pad electrodes PE.

Figure 6:
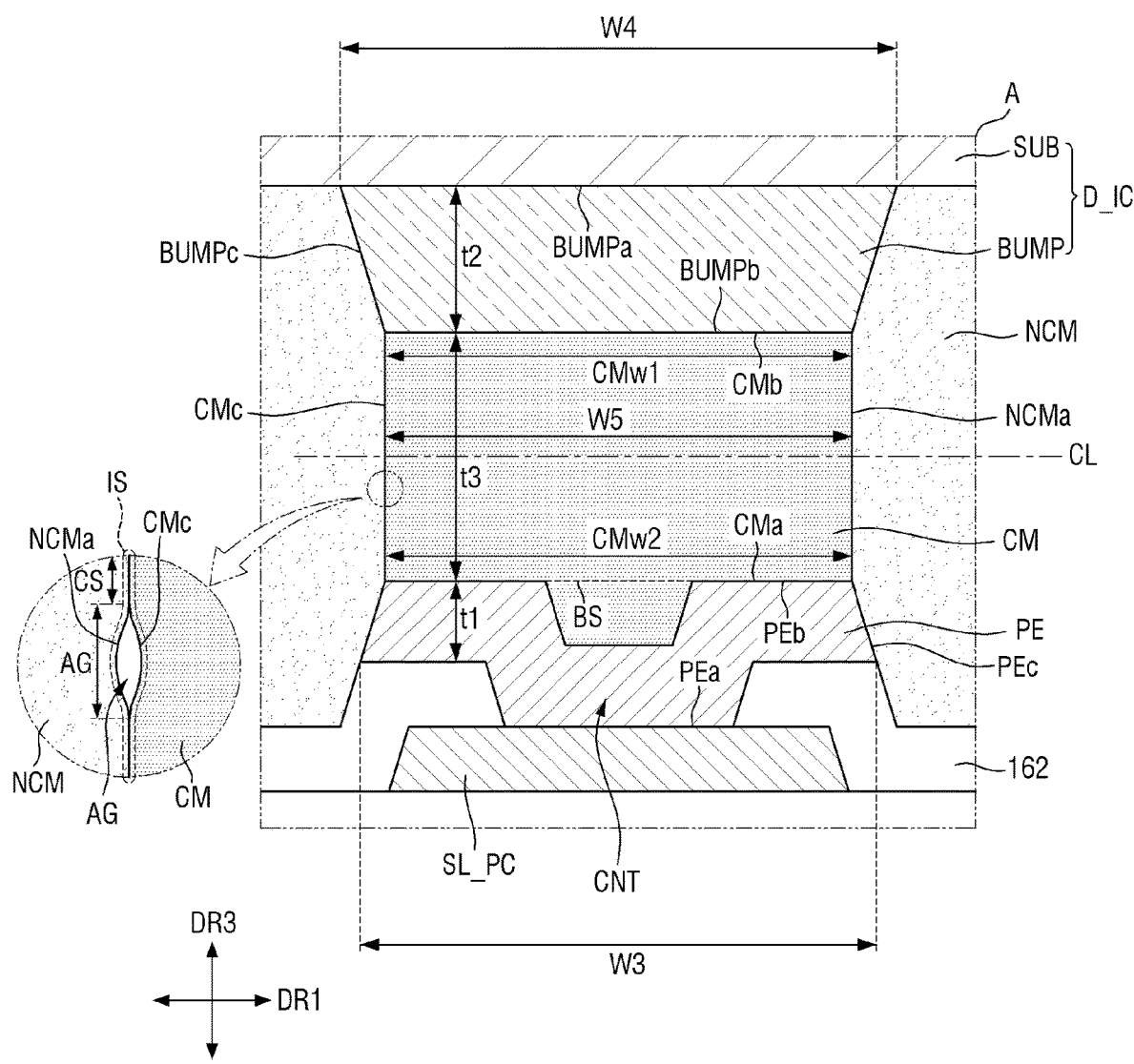
FIG. 6 is a schematic enlarged cross-sectional view of an area A of FIG. 5.

FIG. 6 is a schematic enlarged cross-sectional view of area A of FIG. 5.

Referring to FIG. 6, a bottom surface PEa of a pad electrode PE may directly contact the second insulating layer 162 and part of the top surface of a pad contact part SL_PC, exposed by the second insulating layer 162, and a top surface PEb of the pad electrode PE may directly contact a conductive member CM. A thickness t1 of the pad electrode PE may be uniform. The distance between the top surface PEb and the bottom surface PEa of the pad electrode PE may be uniformly maintained. The top surface PEb of the pad electrode PE may be generally flat in the first direction DR1. In a contact hole CNT, the bottom surface PEa of the pad electrode PE may be recessed to contact the pad contact part SL_PC, and the top surface PEb of the pad electrode PE may be recessed so that the distance between the top surface PEb and the bottom surface PEa of the pad electrode PE may be uniformly maintained. An extension of part of the top surface PEb in the first direction DR1 that does not overlap the contact hole CNT may be defined as a reference plane BS. Side surfaces PEc of the pad electrode PE may be inclined at an acute angle with respect to the bottom surface PEa of the pad electrode PE, but the disclosure is not limited thereto. As another example, the side surfaces PEc of the pad electrode PE may be inclined at an angle (e.g., a right angle) with respect to the bottom surface PEa of the pad electrode PE. The side surfaces PEc of the pad electrode PE may be directly contact non-conductive members NCM.

A top surface BUMPa of a bump BUMP may directly contact the substrate SUB, and a bottom surface BUMPb of the bump BUMP may directly contact the conductive member CM. The conductive member CM may include a top surface CMb and a bottom surface CMa. A thickness t2 of the bump BUMP may be uniform. The distance between the bottom surface BUMPb and the top surface BUMPa of the bump BUMP may be uniformly maintained. The bottom surface BUMPb of the bump BUMP may be flat in the first direction DR1.

The thickness t2 of the bump BUMP may be greater than the thickness t1 of the pad electrode PE. For example, the thickness t2 of the bump BUMP may be about 1.2 or about 1.5 times greater than the thickness t1 of the pad electrode PE, but the disclosure is not limited thereto. As another example, the thickness t2 of the bump BUMP may be the same as the thickness t1 of the pad electrode PE. Side surfaces BUMPc of the bump BUMP may be inclined at an acute angle with respect to the top surface BUMPa of the bump BUMP, but the disclosure is not limited thereto. As another example, the side surfaces BUMPc of the bump BUMP may be inclined at a right angle with respect to the top surface BUMPa of the bump BUMP. The side surfaces BUMPc of the bump BUMP may directly contact the non-conductive members NCM.

The conductive member CM may directly contact the bottom surface BUMPb of the bump BUMP and the top surface PEb of the pad electrode PE. In the contact hole CNT, the conductive member CM may fill the space between the reference plane BS of the pad electrode PE and the top surface PEb of the pad electrode PE. The width of the bottom surface BUMPb of the bump BUMP in the first direction DR1 may be equal to the width of the top surface PEb of the pad electrode PE in the first direction DR1. In case that the bottom surface BUMPb of the bump BUMP and the top surface PEb of the pad electrode PE has the same width in a plan view, the length of the overlapping area or the contact area of the conductive member CM and the bottom surface BUMPb of the bump BUMP may be equal to the length of the overlapping area or the contact area of the conductive member CM and the top surface PEb of the pad electrode PE in the first direction DR1. For example, a length CMw1 of the top surface of the conductive member CM contacting the bottom surface BUMPb of the bump BUMP may be equal to a length CMw2 of the bottom surface of the conductive member CM contacting the reference plane BS of the pad electrode PE.

The side surfaces CMc of the conductive member CM may generally extend in the third direction DR3. For example, the side surfaces CMc of the conductive member CM may be inclined generally at a right angle with respect to the top surface PEb of the pad electrode PE.

Referring to a schematic expanded cross-sectional view of part IS of FIG. 6 where one of the side surfaces CMc of the conductive member CM faces a corresponding side surface NCMa of one of the non-conductive members NCM, portions CS of the side surfaces CMc and NCMa may directly contact each other to form an interface, and portions of the side surfaces CMc and NCMa may be spaced apart from each other by an airgap AG. As will be described below, the non-conductive members NCM may be arranged in the form of non-conductive materials NCM' (see FIG. 10) to be spaced apart from pad electrodes PE and bumps BUMP. During a bonding process, because of heat and pressure, the non-conductive materials NCM' may flow toward conductive materials CM', and a part of the non-conductive materials NCM' may contact the conductive materials CM'(of FIG. 17).

The ratio of the length of the portions of the side surfaces CMc and NCMa that are spaced apart by the airgap AG to the sum of the length of the portions of the side surfaces CMc and NCMa that are spaced apart by the airgap AG and the length of the portions CS of the side surfaces CMc and NCMa may be about 1% or less or about 0.1% or less. In this case, the side surfaces CMc and NCMa may be inclined at a substantially right angle with respect to the top surface PEb of the pad electrode PE.

If the side surfaces CMc of the conductive member CM are inclined at a substantially right angle with respect to the top surface PEb of the pad electrode PE, the conductive member CM may be symmetrical with respect to a reference line CL that equally divides the conductive member CM in the thickness direction, between the reference plane BS of the pad electrode PE and the bottom surface BUMPb of the bump BUMP. Therefore, the length CMw2 of the part of the bottom surface of the conductive member CM contacting the reference plane BS and a width W5 of the conductive member CM along the reference line CL may be the same.

A thickness t3 of the conductive member CM may be greater than the thickness t2 of the bump BUMP and the thickness t1 of the pad electrode PE, but the disclosure is not limited thereto.

Figure 7:
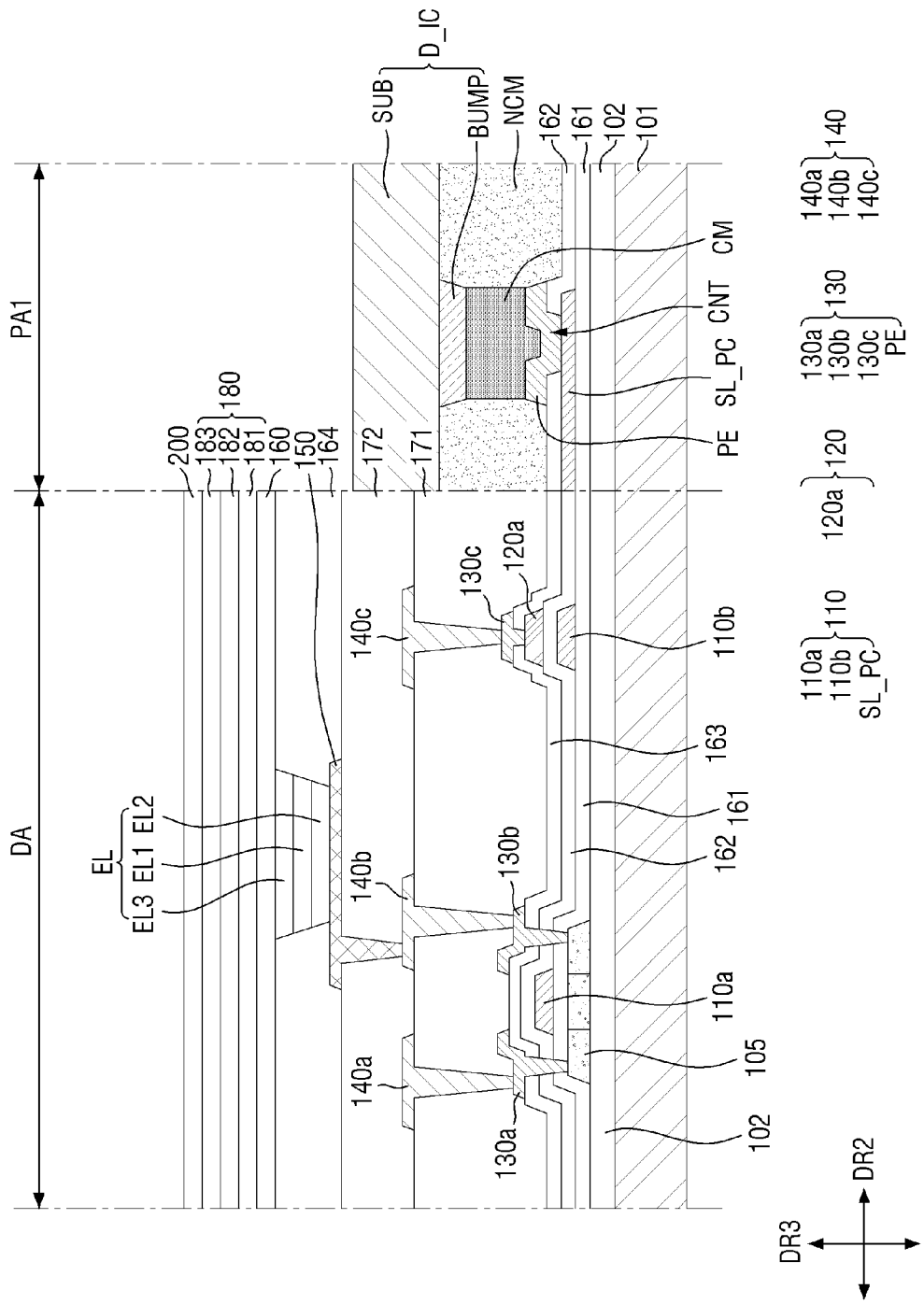
FIG. 7 is a schematic cross-sectional view illustrating a display area and the first pad area of the display device of FIG. 1.

FIG. 7 is a schematic cross-sectional view illustrating the display area and the first pad area of the display device of FIG. 1.

Referring to FIG. 7, the base substrate 101 may support the layers disposed thereon. The base substrate 101 may be disposed in and across the display area DA and the non-display area NDA. For example, the base substrate 101 may be formed of an insulating material such as a polymer resin, but the disclosure is not limited thereto.

The buffer layer 102 may be disposed on the base substrate 101. The buffer layer 102 may be disposed in and across the display area DA and the non-display area NDA. The buffer layer 102 may prevent the diffusion of impurity ions and the penetration of moisture or external air and may perform a surface planarization function. The buffer layer 102 may include silicon nitride, silicon oxide, or silicon oxynitride. The buffer layer 102 may be formed as a single layer or multilayer film.

A semiconductor layer 105 may be disposed on the buffer layer 102. The semiconductor layer 105 may form the channel of a thin-film transistor (TFT). The semiconductor layer 105 may be disposed in each pixel and may be disposed even in the non-display area NDA, as desired.

The first insulating layer 161 may be disposed on the semiconductor layer 105. The first insulating layer 161 may be disposed on the entire surface of the base substrate 101, in and across the display area DA and the non-display area NDA. The first insulating layer 161 may be a gate insulating film having a gate insulating function. The first insulating layer 161 may include an inorganic insulating material.

A first gate conductive layer 110 may be disposed on the first insulating layer 161. For example, the first gate conductive layer 110 may include a gate electrode 110a of the TFT, a first electrode 110b of a storage capacitor, and a signal line (SL_PC and SL_LP). The first gate conductive layer 110 may further include a scan signal line, which transmits a scan signal to the gate electrode 110a.

The gate electrode 110a of the TFT, the first electrode 110b of the storage capacitor, and the signal line (SL_PC and SL_LP) may be formed of the same material by the same process. For example, the first gate conductive layer 110 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second insulating layer 162 may be disposed on the first gate conductive layer 110. The second insulating layer 162 may include a contact hole CNT. The contact hole CNT may expose the top surface of a pad contact part SL_PC. The second insulating layer 162 may insulate the first gate conductive layer 110 from a second gate conductive layer 120. The second insulating layer 162 may include an inorganic insulating material.

The second gate conductive layer 120 may be disposed on the second insulating layer 162. The second gate conductive layer 120 may include a second electrode 120a of the storage capacitor. The second electrode 120a may overlap the first electrode 110b with the second insulating layer 162 interposed therebetween. For example, the first and second electrodes 110b and 120a may form the storage capacitor, which has the second insulating layer 162 as its dielectric film.

The second gate conductive layer 120 may include at least one metal selected from among Mo, Al, Pt, Pd, Ag, Mg, Au, Ni, Nd, Ir, Cr, Ca, Ti, Ta, W, and Cu.

A third insulating layer 163 may be disposed on the second gate conductive layer 120. The third insulating layer 163 may insulate the second gate conductive layer 120 from a first source/drain conductive layer 130. The third insulating layer 163 may include an inorganic insulating material.

The first source/drain conductive layer 130 may be disposed on the third insulating layer 163. For example, the first source/drain conductive layer 130 may include a source electrode 130a and a drain electrode 130b of the TFT, a power supply voltage electrode 130c, and a pad electrode PE. The source electrode 130a and the drain electrode 130b may be electrically connected to a source region and a drain region, respectively, of the semiconductor layer 105 through contact holes that penetrate through the third insulating layer 163, the second insulating layer 162, and the first insulating layer 161.

The pad electrode PE may be disposed in the first pad area PA1. The pad electrode PE may overlap the pad contact part SL_PC and may be electrically connected to the pad contact part SL_PC through the contact hole CNT.

Layers including a first via layer 171 may be stacked on the first source/drain conductive layer 130, and the layers disposed on the first source/drain conductive layer 130 may expose the pad electrode PE because they are not disposed in the first pad area PA1 of the non-display area NDA.

The first source/drain conductive layer 130 may include at least one metal selected from among Al, Pt, Pd, Ag, Mg, Au, Ni, Nd, Ir, Cr, Ca, Ti, Ta, W, Cu, and Mo.

The first via layer 171 may be disposed on the first source/drain conductive layer 130. The first via layer 171 may include an organic insulating material.

A second source/drain conductive layer 140 may be disposed on the first via layer 171. The second source/drain conductive layer 140 may include a data signal line 140a, a connecting electrode 140b, and a power supply voltage line 140c. The data signal line 140a may be electrically connected to the source electrode 130a of the TFT via a contact hole that penetrates through the first via layer 171. The connecting electrode 140b may be electrically connected to the drain electrode 130b of the TFT via a contact hole that penetrates through the first via layer 171. The power supply voltage line 140*c* may be electrically connected to the power supply voltage electrode 130*c* via a contact hole that penetrates through the first via layer 171.

The second source/drain conductive layer 140 may include at least one metal selected from among Al, Pt, Pd, Ag, Mg, Au, Ni, Nd, Ir, Cr, Ca, Ti, Ta, W, Cu, and Mo.

A second via layer 172 may be disposed on the second source/drain conductive layer 140. The second via layer 172 may include an organic insulating material.

An anode electrode 150 may be disposed on the second via layer 172. The anode electrode 150 may be electrically connected to the connecting electrode 140*b* via a contact hole that penetrates through the second via layer 172 and may thus be electrically connected to the drain electrode 130*b* of the TFT.

A pixel-defining film 164 may be disposed on the anode electrode 150. The pixel-defining film 164 may include an opening that exposes the anode electrode 150. The pixel-defining film 164 may be formed of an organic insulating material or an inorganic insulating material. For example, the pixel-defining film 164 may include a material such as photoresist, a polyimide resin, an acrylic resin, a silicon compound, or a polyacrylic resin.

An organic layer EL may be disposed on the top surface of the anode electrode 150 and in the opening of the pixel-defining film 164. The organic layer EL is illustrated in FIG. 7 as being disposed only in the opening of the pixel-defining film 164, but the disclosure is not limited thereto. The organic layer EL may extend from the opening of the pixel-defining film 164 to the top surface of the pixel-defining film 164.

The organic layer EL may include an organic light-emitting layer EL1, a hole injection/transport layer EL2, and an electron injection/transport layer EL3. The hole injection/transport layer EL2 and the electron injection/transport layer EL3 are illustrated in FIG. 7 as being single-layer films. However, in another embodiment, they may be stacks of multiple injection layers and multiple transport layers. At least one of the hole injection/transport layers EL2 and EL3 may be a common layer disposed across pixels.

A cathode electrode 160 may be disposed on the organic layer EL and the pixel-defining film 164. The cathode electrode 160 may be a common electrode disposed across pixels.

A thin-film encapsulation layer 180 may be disposed on the organic layer EL. The thin-film encapsulation layer 180 may cover or overlap an organic light-emitting element (OLED). The thin-film encapsulation layer 180 may be a laminated film in which at least one inorganic film and at least one organic film are alternately stacked. For example, the thin-film encapsulation layer 180 may include a first inorganic film 181, an organic film 182, and a second inorganic film 183, which are sequentially stacked.

A touch member 200 may be disposed on the thin-film encapsulation layer 180. For example, the touch member 200 may be of an electrostatic capacitive type. The touch member 200 may be disposed directly on the thin-film encapsulation layer 180 without the aid of an additional adhesive layer or may be connected to the thin-film encapsulation layer 180 via an adhesive layer.

A method of manufacturing a display device according to an embodiment will hereinafter be described. Like reference numerals indicate like elements throughout the disclosure, and descriptions of elements or features that have already been described above will be omitted or simplified.

Figure 8:
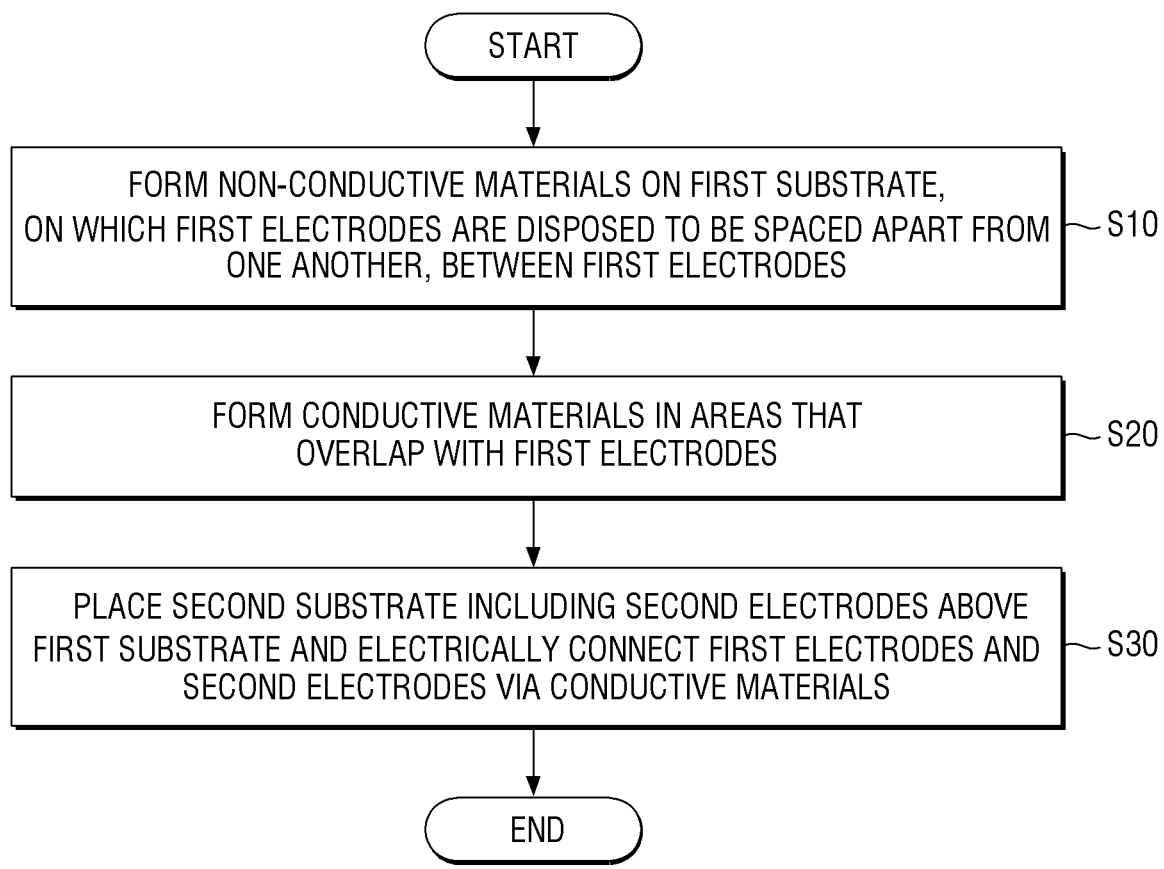
FIG. 8 is a schematic flowchart illustrating a method of manufacturing a display device according to an embodiment of the disclosure.

FIG. 8 is a schematic flowchart illustrating a method of manufacturing a display device according to an embodiment. FIGS. 9, 10, and 12 through 16 are schematic cross-sectional views illustrating the method of FIG. 8. FIG. 11 is a schematic cross-sectional view illustrating how to form non-conductive materials by inkjet printing.

Figure 9:
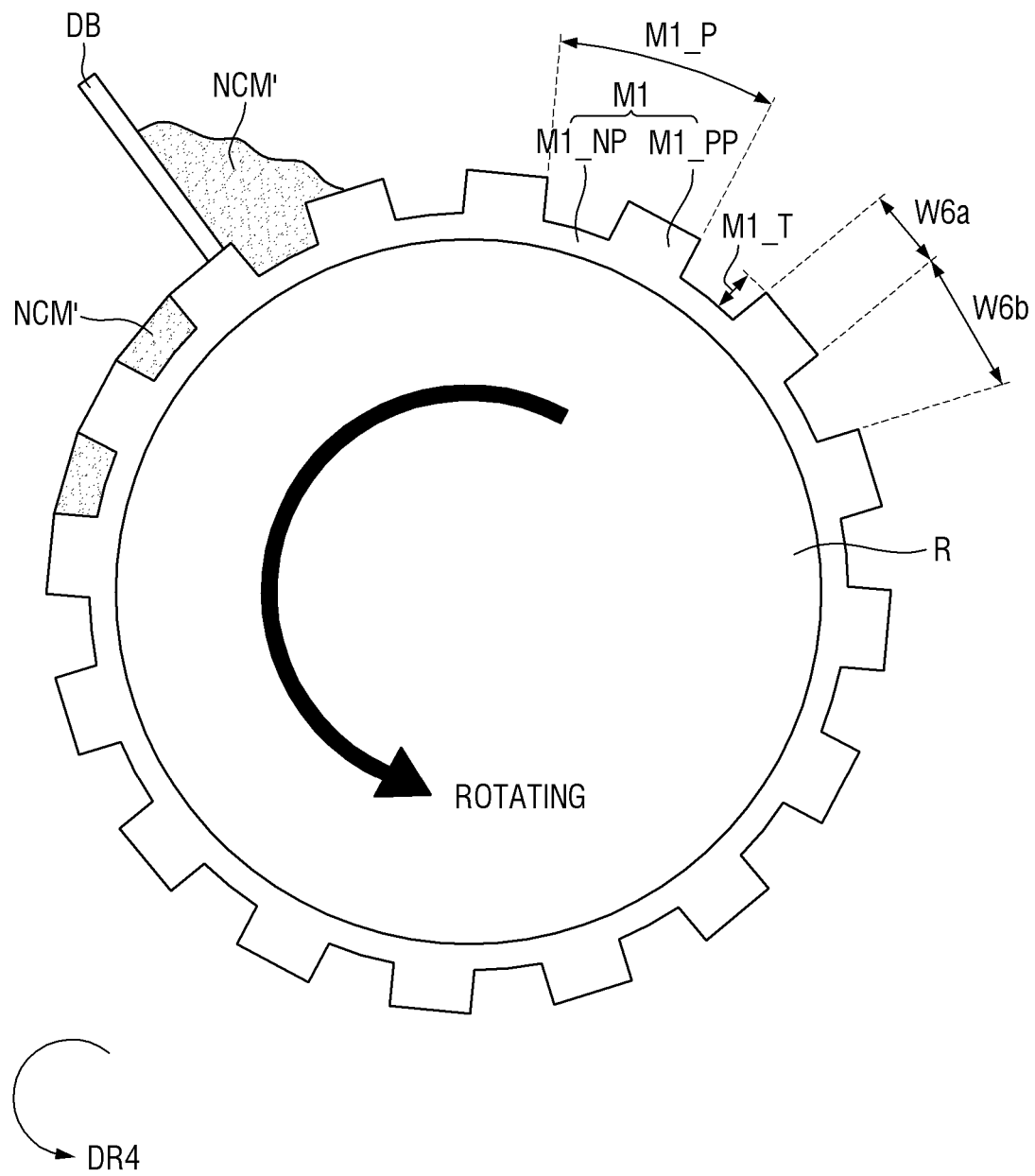
FIGS. 9, 10, and 12 through 16 are schematic cross-sectional views illustrating the method of FIG. 8.
Figure 10:
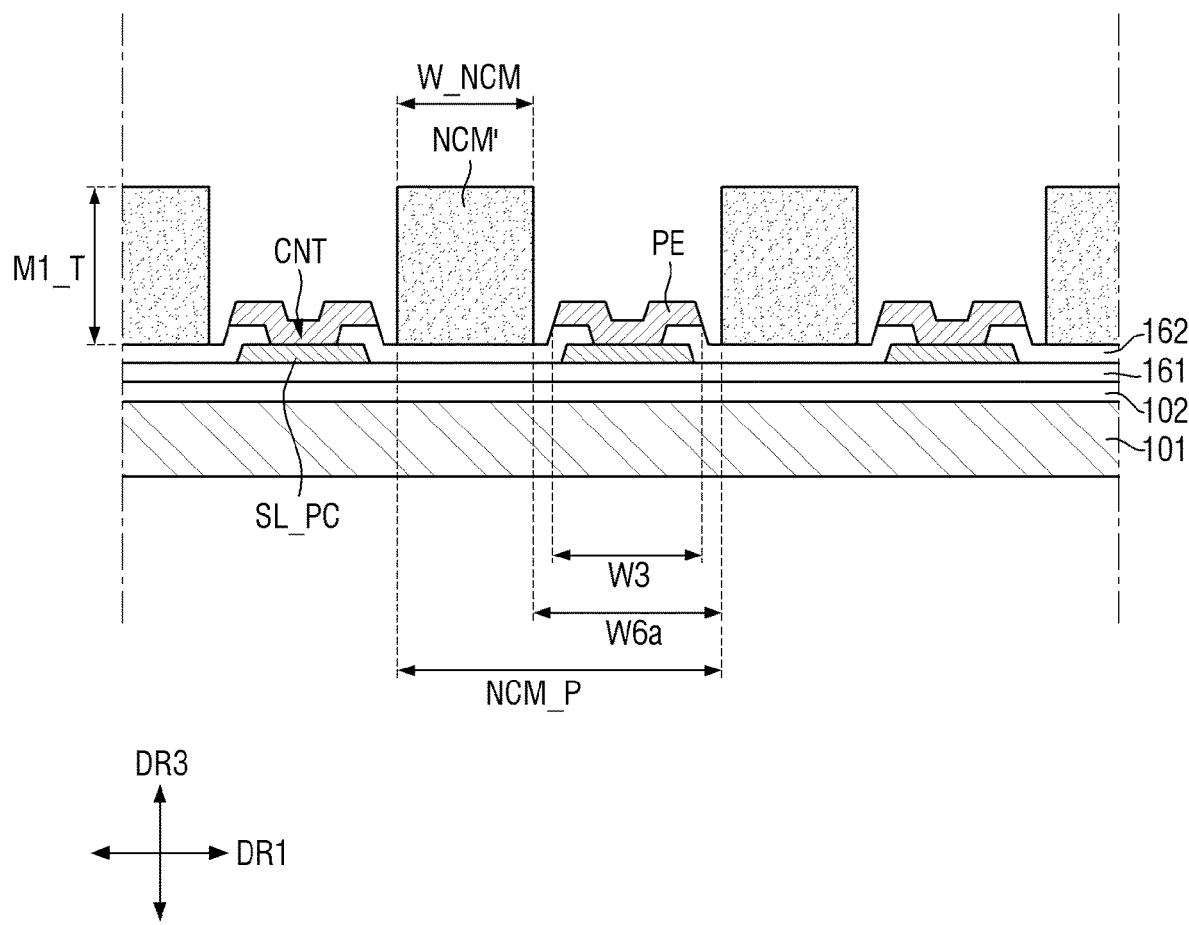

Referring to FIGS. 8 through 10, non-conductive materials NCM' may be formed on a first substrate, on which first electrodes are disposed to be spaced apart from one another between the first electrodes (S10). The first electrodes may be pad electrodes PE, and the first substrate may be a base substrate 101. The base substrate 101, first and second insulating layers 161 and 162, a buffer layer 102, pad contact parts SL_PC, and the pad electrodes PE are as already described above with reference to FIGS. 5 and 6, and thus, detailed descriptions thereof will be omitted.

The non-conductive materials NCM' may be formed by gravure printing. Referring to FIG. 9, the rotation direction of a rotating part R of a gravure printing device, for example, a counterclockwise direction, is defined as a fourth direction DR4. The gravure printing device may include the rotating part R, which rotates in the fourth direction DR4, a first mold M1, which is connected to the rotating part R and rotates in the fourth direction DR4 together with the rotating part R, and a fixing part DB, which is affixed to a position at a uniform distance from the rotating part R regardless of the rotation of the rotating part R and the first mold M1.

The rotating part R may have a circular cross-sectional shape. The rotating part R may be formed of a rigid material, but the disclosure is not limited thereto. The rotating part R may be formed of a more rigid material than the first mold M1.

The first mold M1 may rotate in the rotation direction of the rotating part R while being coupled to the rotating part R, when the rotating part R rotates. As illustrated in FIG. 9, the first mold M1 may include depressed parts M1_NP and embossed parts M1_PP, which have a higher surface height than the depressed parts M1_NP. For example, the embossed parts M1_PP may protrude beyond the surfaces of the depressed parts M1_NP in the thickness direction of the depressed parts M1_NP. The thicknesses of the depressed parts M1_NP and the embossed parts M1_PP may be formed to be uniform.

The depressed parts M1_NP and the embossed parts M1_PP may be physically connected and may be alternately arranged in the fourth direction DR4. The surface height of the depressed parts M1_NP and the surface height of the embossed parts M1_PP may differ by a predetermined height M1_T.

The first mold M1 may be formed of a more flexible material than the rotating part R. The first mold M1 may be formed of a polymer material such as polydimethylsiloxane (PDMS) or poly(methyl methacrylate) (PMMA). In case that the first mold M1 is connected to the rotating part R, the bottom surface of the first mold M1 that contacts the surface of the rotating part R may have a curvature equal to that of the surface of the rotating part R. Since the first mold M1 is formed of a flexible material, the bottom surface of the first mold M1 may be unfolded to have a flat shape, once the first mold M1 is detached from the rotating part R. A pitch M1_P of the embossed parts M1_PP or the depressed parts M1_NP of the first mold M1, a width W6*a* of the embossed parts M1_PP, and a width W6*b* of the depressed parts M1_NP may differ by about 10% or less or about 5% or less in case that the first mold M1 is connected to the rotating part R than in case that the first mold M1 is detached from the rotating part R and has a flat shape. In other words, the pitch M1_P of the embossed parts M1_PP or the depressed parts M1_NP of the first mold M1, the width W6a of the embossed parts M1_PP, and the width W6b of the depressed parts M1_NP may be substantially the same. The pitch M1_P of the embossed parts M1_PP or the depressed parts M1_NP of the first mold M1 may be substantially equal to the pitch NCM_P of the non-conductive materials NCM' of FIG. 10; the width W6b of the depressed parts M1_NP may be substantially equal to a width W_NCM of the non-conductive materials NCM'; and the width W6a of the embossed parts M1_PP may be greater than a width W3 of pad electrodes PE of FIG. 10. Since the width W6a of the embossed parts M1_PP is substantially equal to the distance between the non-conductive materials NCM', the non-conductive materials NCM' may be formed to separate the pad electrodes PE from one another.

The non-conductive materials NCM' may fill the depressed parts M1_NP. As illustrated in FIG. 9, the non-conductive materials NCM' may completely fill the depressed parts M1_NP. The fixing part DB, which does not rotate and is affixed, may retain the non-conductive materials NCM' on its right side such that the non-conductive materials NCM' do not flow to its left side but fill the depressed parts M1_NP in accordance with the rotation of the first mold M1.

The non-conductive materials NCM' that fully fill the depressed parts M1_NP may move upon the rotation of the first mold M1. The fixing part DB may be spaced apart from the rotating part R by a predetermined distance, and thus, as the non-conductive materials NCM' pass through the fixing part DB, the non-conductive materials NCM' may be formed in the depressed parts M1_NP to have the same surface height as the embossed parts M1_PP adjacent M1_PP the depressed parts M1_NP. As the fixing part DB directly contacts the embossed parts M1_PP from above the embossed parts M1_PP, the non-conductive materials NCM' may not be formed on the embossed parts M1_PP.

Although not specifically illustrated, the fixing part DB may be fixed by another fixing means to be spaced apart from the rotating part R by a predetermined distance and not to rotate along with the rotating part R.

In case that the depressed parts M1_NP of the first mold M1 are fully filled with the non-conductive materials NCM', the first mold M1 may be detached from the rotating part R, and the non-conductive materials NCM' may be transferred from the first mold M1 into the gaps between the pad electrodes PE, as illustrated in FIG. 10. The adhesion of the non-conductive materials NCM' to the first mold M1 may be weaker than that of the non-conductive materials NCM' to the second insulating layer 162, in which case, the transfer of the non-conductive materials NCM' may be facilitated. To reduce the adhesion of the non-conductive materials NCM' to the first mold M1, a thermal treatment may be additionally performed thereon, but the disclosure is not limited thereto.

The non-conductive materials NCM' may be disposed between the pad electrodes PE to be spaced apart from the pad electrodes PE. As will be described below, the non-conductive materials NCM' may have fluidity because of heat while the thickness of the non-conductive materials NCM' is being reduced (to M1_T' of FIG. 16) by downward pressure in the process of bonding a driving member D_IC. However, since the non-conductive materials NCM' are disposed to be spaced apart from the pad electrodes PE, a space in which the non-conductive materials NCM' may flow may be provided, and as a result, the non-conducive materials NCM' may be prevented from agglomerating in particular regions or from excessively pushing away the conductive materials CM' and thereby reducing a space in which to arrange the conductive materials CM'.

In another example, as illustrated in FIG. 11, the non-conductive materials NCM' may be formed by an inkjet printing device ID. The inkjet printing device ID may include at least one nozzle NZ (e.g., first and second nozzles NZ1 and NZ2) and may form the non-conductive materials NCM' in the depressed parts M1_NP of the first mold M1 by the nozzle NZ. FIG. 11 illustrates that the inkjet printing device ID includes one nozzle NZ, but the disclosure is not limited thereto. As another example, the inkjet printing device ID may include multiple nozzles NZ. In case that the nozzle NZ is aligned with each of the depressed parts M1_NP, the non-conductive materials NCM' may be formed, but not on the embossed parts M1_PP, to precisely fill the depressed parts M1_NP. Therefore, the non-conductive materials NCM' may be more precisely formed in the first mold M1.

Referring to FIGS. 8 and 12 through 14, conductive materials CM' may be formed in areas that overlap the first electrodes (S20). Here, the first electrodes may be the pad electrodes PE. For example, the conductive materials CM' may be formed in areas that overlap the pad electrodes PE (S20). The conductive materials CM' may be formed by embossed printing. Embossed printing may be performed by a second mold M2. The formation (S20) of the conductive materials CM' in the areas that overlap the first electrodes may be performed after the formation (S10) of the non-conductive materials NCM'. As another example, step S20 may be performed before step S10. For example, the order in which the conductive materials CM' and the non-conductive materials NCM' are formed may vary, as desired.

The second mold M2 may include at least one of the aforementioned materials of the first mold M1 of FIG. 9. The second mold M2 may include depressed parts M2_NP and embossed parts M2_PP, which have a higher surface height than the depressed parts M2_NP. For example, the embossed parts M2_PP are projected beyond the surfaces of the depressed parts M2_NP in the thickness direction of the depressed parts M2_NP. The thicknesses of the depressed parts M2_NP and the embossed parts M2_PP may be uniform.

The depressed parts M2_NP and the embossed parts M2_PP may be physically connected and may be alternately arranged in a direction (e.g., a horizontal direction).

Figure 12:
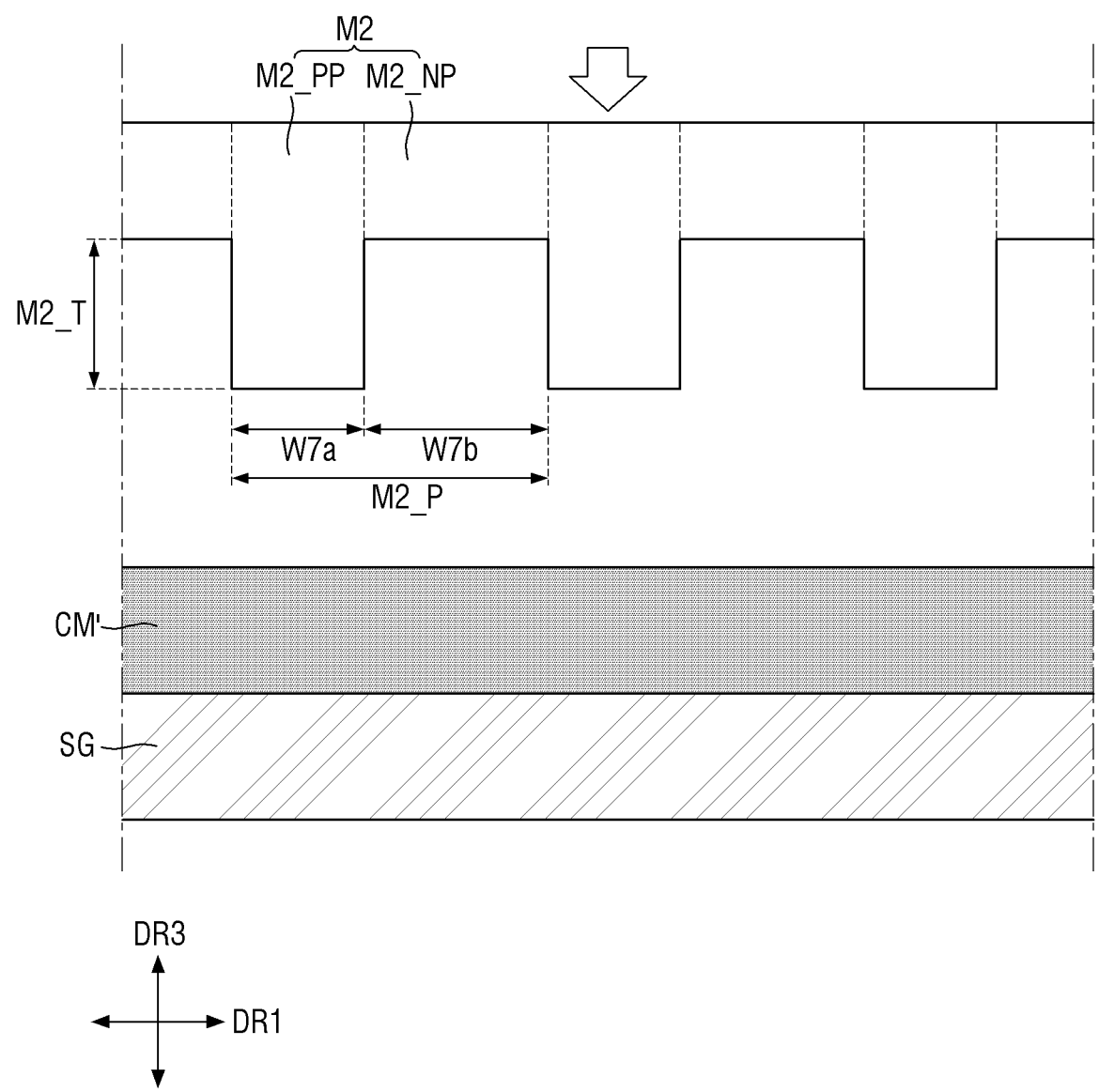
Figure 14:
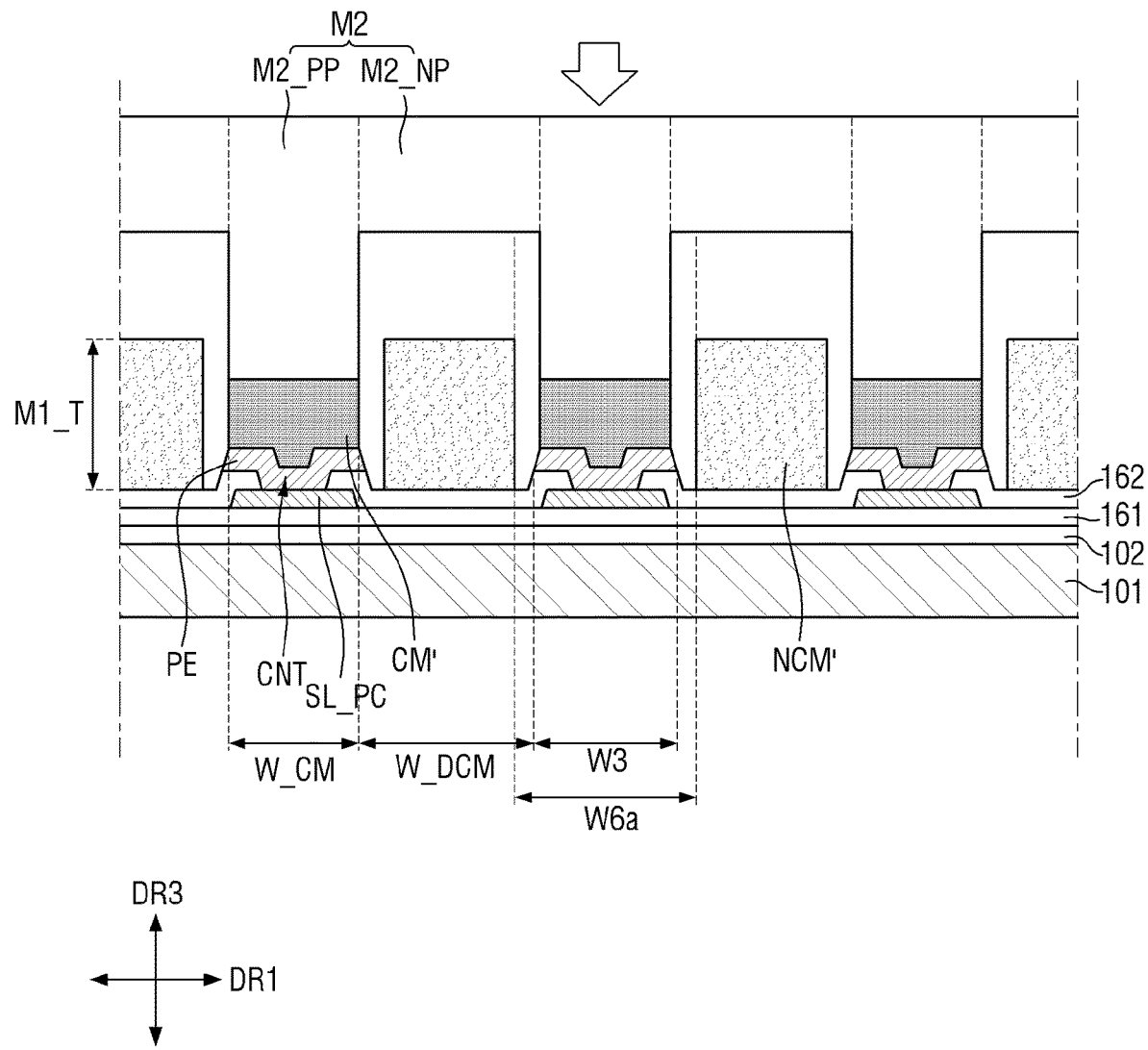

Referring to FIG. 12, a pitch M2_P of the embossed parts M2_PP or the depressed parts M2_NP may be substantially equal to that of the conductive materials CM' of FIG. 14, a width W7b of the depressed parts M2_NP may be substantially equal to a distance W_DCM between the conductive materials CM' of FIG. 14, and a width W7a of the embossed parts M2_PP may be substantially equal to a width W_CM of the conductive materials CM' of FIG. 14.

The second mold M2 may be placed above the conductive materials CM' such that the embossed parts M2_PP of the second mold M2 may face the conductive materials CM', which are disposed on a stage SG. The conductive materials CM' may include a material that is thermally cured to connect adjacent members (or patterns). The conductive materials CM' may include an adhesive resin dissolved in a solvent and metal powder having conductivity.

Figure 13:
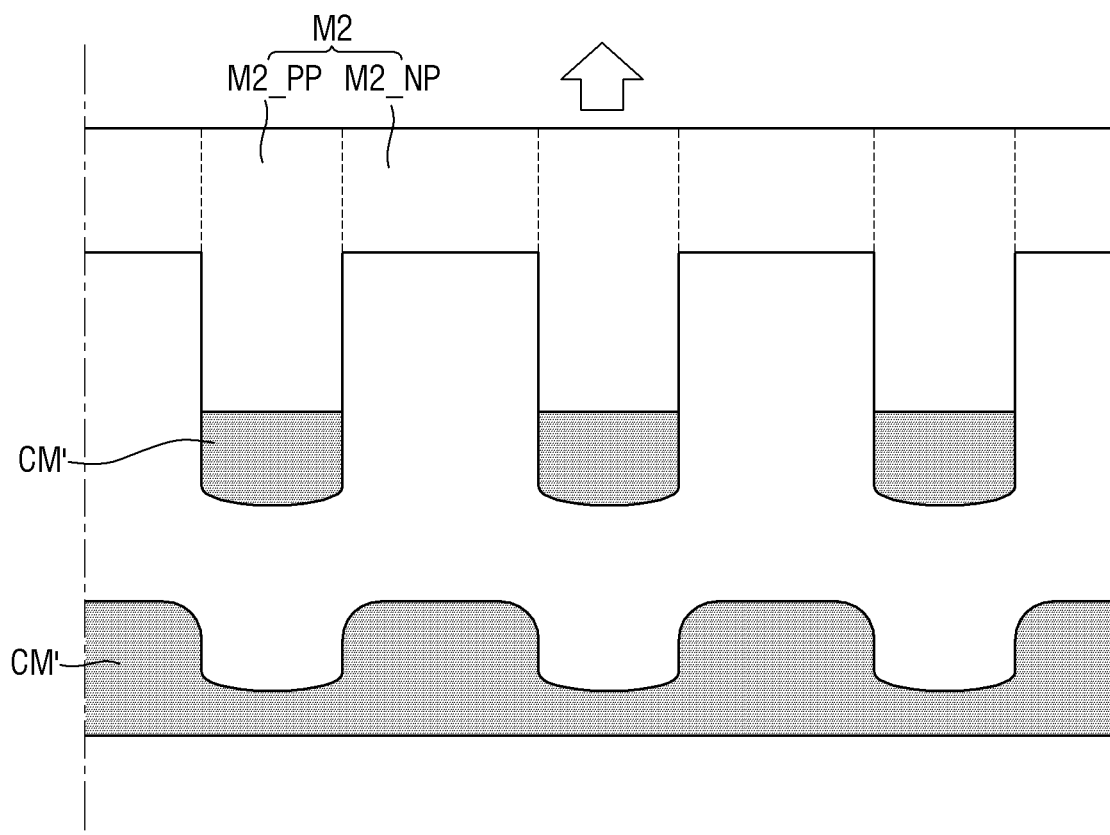

Thereafter, referring to FIG. 13, the second mold M2 may contact the conductive materials CM' so that the conductive materials CM' are transferred to the second mold M2. The conductive materials CM' may be transferred to surfaces (e.g., the bottom surfaces) of the embossed parts M2_PP that are at ends of the embossed parts M2_PP in the third direction DR3 and extend horizontally. In case that the second mold M2 is lowered to contact the conductive materials CM', the embossed parts M2_PP of the second mold M2 may apply predetermined pressure to the surfaces of the conductive materials CM' on the stage SG and may compress the conductive materials CM' so that some of the conductive materials CM' may be attached to the bottom surfaces of the embossed parts M2_PP, as illustrated in FIG. 13. For example, the width W7a of the embossed parts M2_PP may be equal to the width by which the conductive materials CM' is attached to the bottom surfaces of the embossed parts M2_PP. The conductive materials CM' may be properly attached to the bottom surfaces of the embossed parts M2_PP if the adhesion of the conductive materials CM' to the bottom surfaces of the embossed parts M2_PP is stronger than the bonding force within the conductive materials CM'. The adhesion of the conductive materials CM' to the bottom surfaces of the embossed parts M2_PP tends to increase in accordance with the conductive materials CM' and the material of the embossed parts M2_PP (or the material of the second mold M2) and with the pressure applied to the conductive materials CM' in case that the second mold M2 is being lowered. As illustrated in FIGS. 13 and 14, the conductive materials CM' may have an adhesion greater than a predetermined level to maintain a predetermined thickness and be properly transferred to the second mold M2.

As the conductive members CM' may not be attached to the inside of the depressed parts M2_NP of the second mold M2, the difference between the surface height of the depressed parts M2_NP and the surface height of the embossed parts M2_PP (i.e., M2_T) may be greater than the depth to which the conductive materials CM' on the stage SG are compressed by the embossed parts M2_PP in case that the second mold M2 is lowered, for process reliability.

Referring to FIG. 14, once the conductive materials CM' are transferred to the second mold M2, the conductive materials CM' may be transferred to the pad electrodes PE by lowering the second mold M2.

The adhesion of the conductive materials CM' to the second mold M2 may be weaker than the adhesion of the conductive materials CM' to the pad electrodes PE, in which case, the conductive materials CM' may be readily transferred. To reduce the adhesion of the conductive materials CM' to the second mold M2, a thermal treatment may be additionally performed, but the disclosure is not limited thereto.

As already mentioned above, since the non-conductive materials NCM' may be formed to be spaced apart from the pad electrodes PE and the conductive materials CM' may be formed to overlap the pad electrodes PE, the non-conductive materials NCM' and the conductive materials CM' may be spaced apart from each other by gaps therebetween until a bonding process is performed.

Prior to a bonding process, the non-conductive materials NCM' and the conductive materials CM' may be formed on the base substrate 101.

Figure 15:
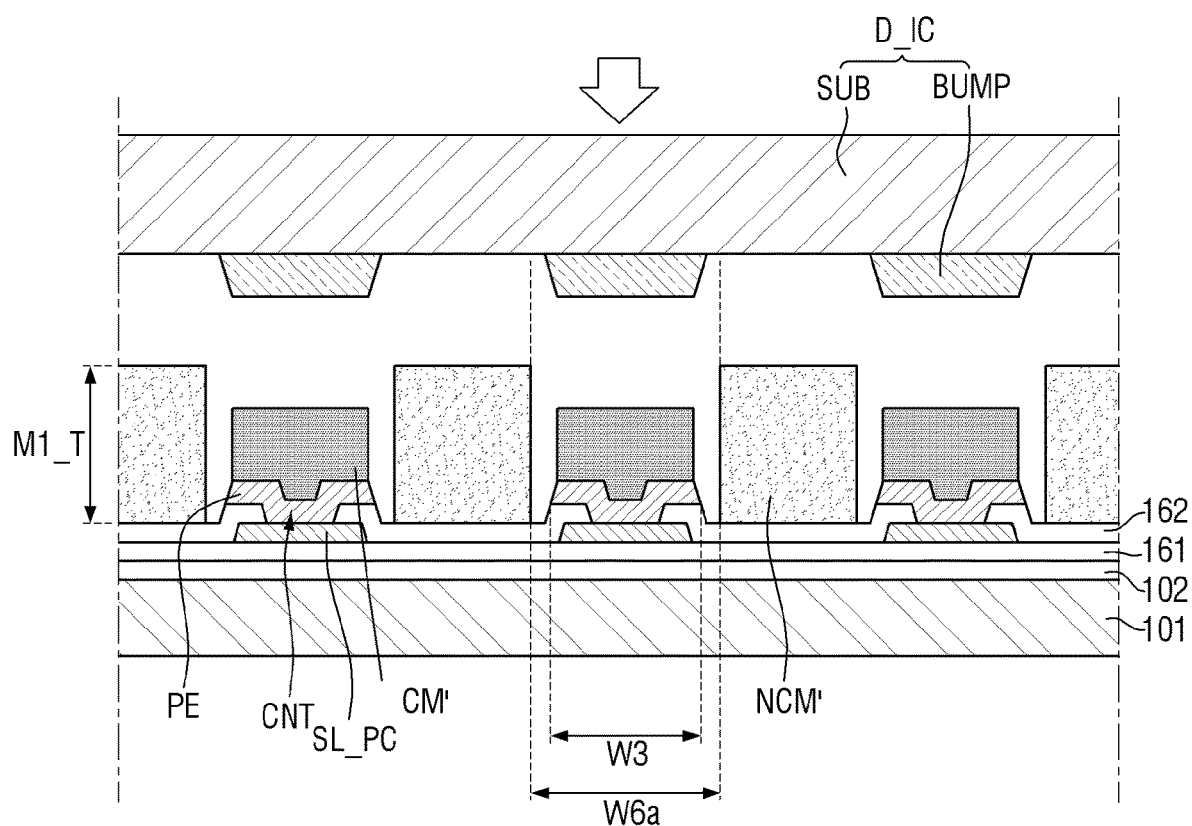
Figure 16:
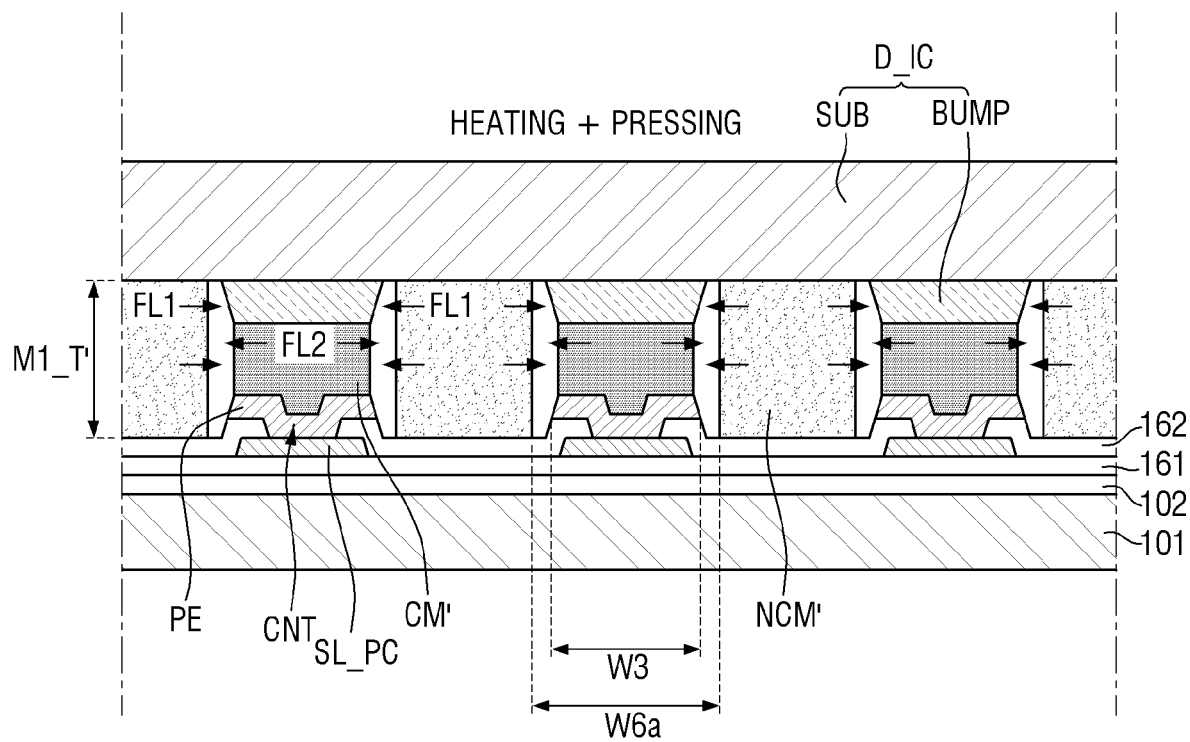

Thereafter, referring to FIGS. 8, 15, and 16, a second substrate including second electrodes may be placed above the first substrate, and the first electrodes and the second electrodes may be electrically connected via the conductive materials CM' (S30). Here, the second electrodes may be bumps BUMP, the first substrate may be the base substrate 101, and the first electrodes may be the pad electrodes PE. For example, a driving member D_IC including the bumps BUMP may be placed above the base substrate 101, and the pad electrodes PE and the bumps BUMP may be electrically connected (or coupled) via the conductive materials CM' (S30).

Specifically, as illustrated in FIG. 15, the driving member D_IC may be disposed to be spaced apart from the conductive materials CM' and the non-conductive materials NCM' in a thickness direction. In this case, the bumps BUMP may be disposed on a substrate SUB, and the substrate SUB may face the base substrate 101. The driving member D_IC may be placed above the base substrate 101 such that the bumps BUMP may face the conductive materials CM'. The bumps BUMP may be disposed to overlap the conductive materials CM' in the thickness direction.

Thereafter, as illustrated in FIG. 16, the driving member D_IC may be lowered such that the bumps BUMP contact the conductive materials CM', each of which is overlapped by a corresponding one of the bumps BUMP. In this case, the non-conductive materials NCM' may also contact the substrate SUB.

Thereafter, the pad electrodes PE and the bumps BUMP may be electrically connected by applying downward pressure and heat toward the substrate SUB. In more detail, the driving member D_IC may be lowered such that the bumps BUMP contact the conductive materials CM', and pressure and heat may be applied to the substrate SUB from above the substrate SUB. The conductive materials CM' and the non-conductive materials NCM' may have fluidity due to the heat applied thereto, and as the conductive materials CM' and the non-conductive materials NCM' are compressed by the pressure applied thereto, the thickness of the conductive materials CM' and the non-conductive materials NCM' may be reduced. As a result, the non-conductive materials NCM' may have fluidity FL1 toward the conductive materials CM' by a reduction in the thickness thereof, and the conductive materials CM' may have fluidity FL2 toward the non-conductive materials NCM' by a reduction in the thickness thereof. The fluidities (FL1 and FL2) may be as much as a reduction in the thickness. The fluidity FL1 of the non-conductive materials NCM' may vary depending on the pressure and heat applied to the non-conductive materials NCM' and the materials of the non-conductive materials NCM', and the fluidity FL2 of the conductive materials CM' may vary depending on the pressure and heat applied to the conductive materials CM' and the materials of the conductive materials CM'. In this manner, the gaps between the non-conductive materials NCM' and the conductive materials CM' may be filled by the fluidity FL1 of the non-conductive materials NCM' and the fluidity FL2 of the conductive materials CM'.

Figure 17:
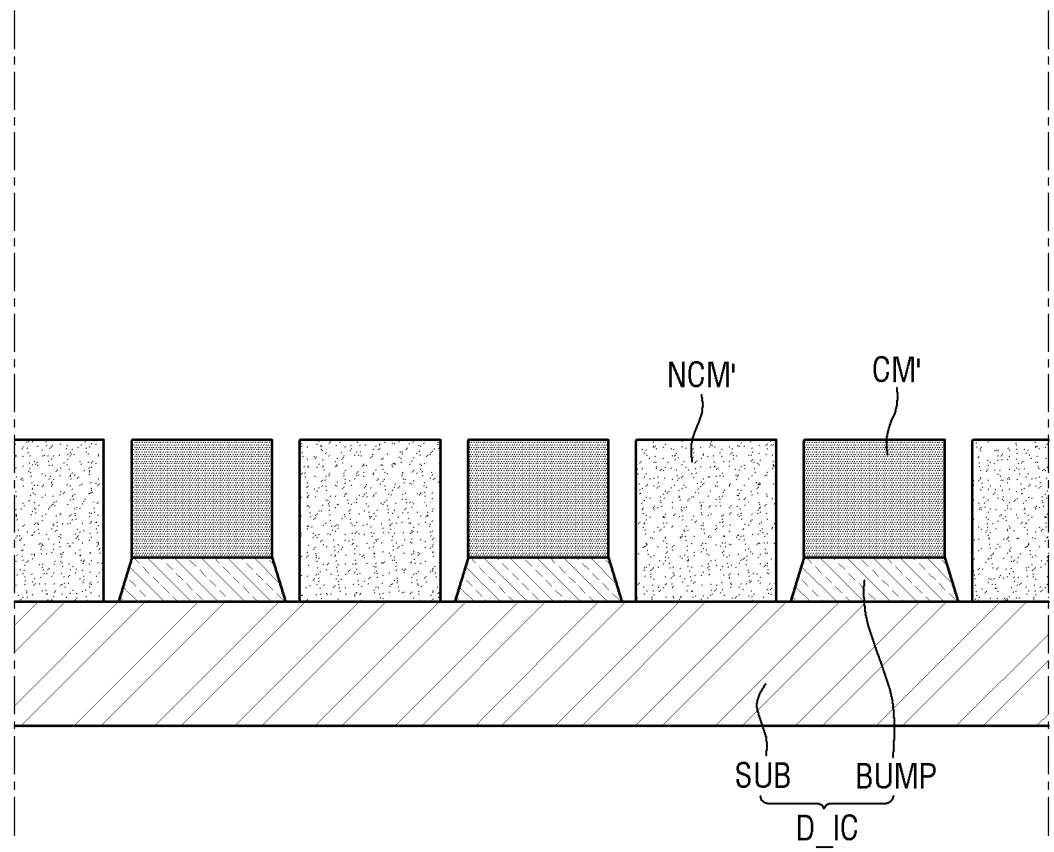

FIGS. 17 and 18 are schematic cross-sectional views illustrating a method of manufacturing a display device according to another embodiment.

The embodiment of FIGS. 17 and 18 differs from the embodiment(s) of FIGS. 9, 10, and 12 through 16 in that conductive materials CM' and non-conductive materials NCM' are formed on a substrate SUB of a driving member D_IC prior to a bonding process.

For example, referring to FIGS. 9, 10, and 12 through 16, non-conductive materials may be formed on a first substrate, on which first electrodes are disposed to be spaced apart from one another, between the first electrodes (S10), conductive materials may be formed in areas that overlap the first electrodes (S20), and the first electrodes and the second electrodes are electrically connected by the conductive materials (S30) by placing a second substrate including second electrodes above the first substrate. Here, the first substrate may be a base substrate 101, the first electrodes may be pad electrodes PE, the second substrate may be the substrate SUB, and the second electrodes may be bumps BUMP.

Referring to FIG. 17, the conductive materials CM' may be formed on the bumps BUMP to overlap the bumps BUMP, and the non-conductive materials NCM' may be formed between the bumps BUMP. The pitch of the conductive materials CM', the pitch of the non-conductive materials NCM', the arrangement of the non-conductive materials NCM' relative to the bumps BUMP, and the arrangement of the non-conductive materials NCM' relative to the conductive materials CM' may be substantially the same as those described above with reference to FIGS. 9, 10, and 12 through 16.

The formation of the conductive materials CM' and the formation of the non-conductive materials NCM' may be as already described above with reference to FIGS. 9 and 11 through 14, and thus, detailed descriptions thereof will be omitted.

Referring to FIG. 18, the non-conductive materials NCM' and the conductive materials CM', which are formed on the driving member D_IC, may be placed on the pad electrodes PE and a second insulating layer 162 to face the pad electrodes PE and the second insulating layer 162, and the pad electrodes PE and the bumps BUMP may be electrically connected while the non-conductive materials NCM' and the conductive materials CM' contact the pad electrodes PE and the second insulating layer 162.

Figure 19:
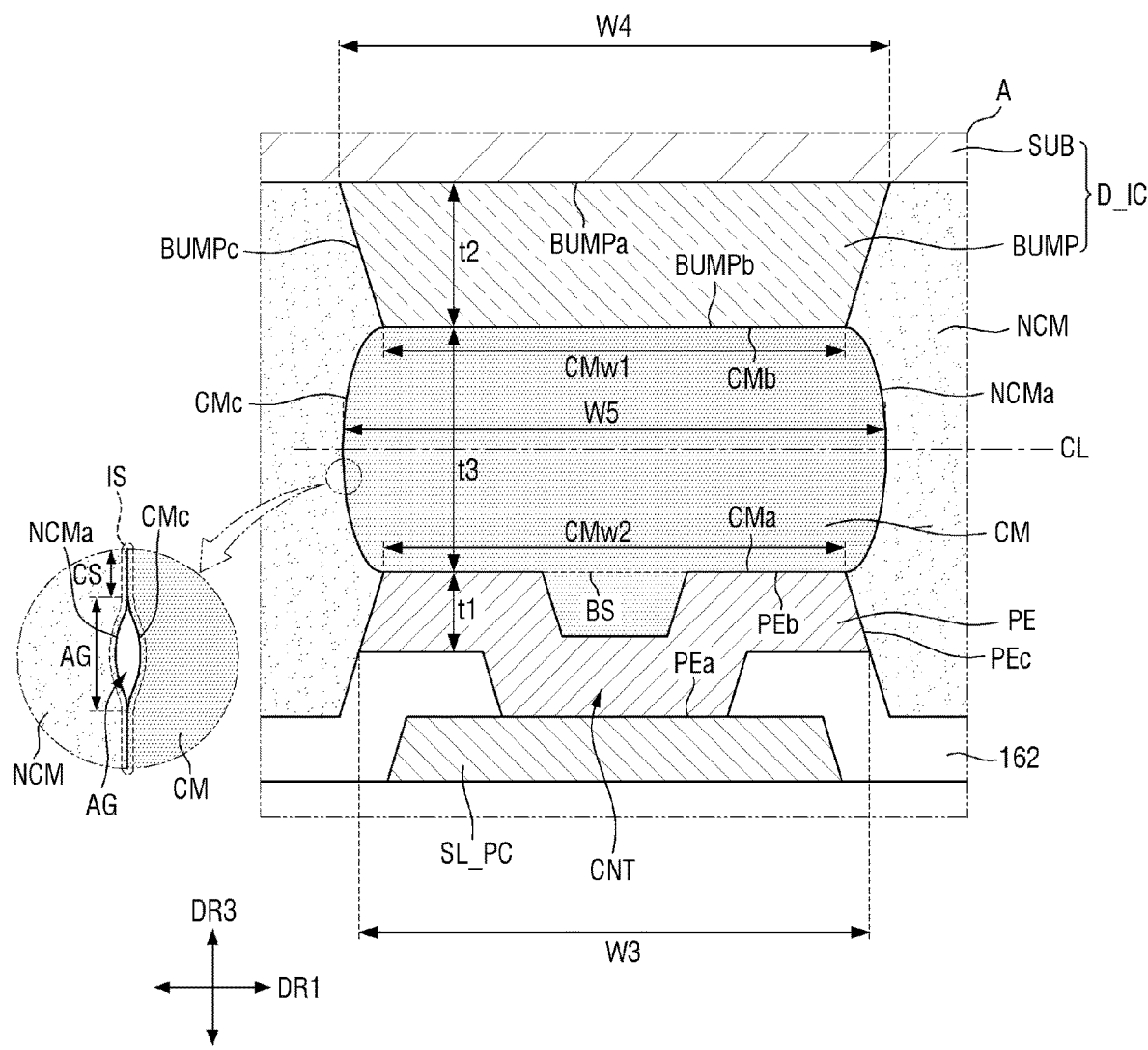
FIG. 19 is a schematic cross-sectional view of a display device according to another embodiment of the disclosure.

FIG. 19 is a schematic cross-sectional view of a display device according to another embodiment.

Referring to FIG. 19, the display device of FIG. 19 differs from the display device of FIG. 6 at least in that side surfaces CMc of a conductive member CM are outwardly convex from the center thereof.

A length CMw2 of part of the bottom surface of the conductive member CM contacting a reference plane BS of a pad electrode PE and a length CMw1 of part of the top surface of the conductive member CM contacting a bottom surface BUMPb of a bump BUMP may be smaller than a width W5 of the conductive member CM along a reference line CL.

In the embodiment of FIG. 19, the conductive member CM may be symmetrical with respect to the reference line CL that equally divides the conductive member CM in a thickness direction, between the reference plane BS of the pad electrode PE and the bottom surface BUMPb of the bump BUMP.

As already described above with reference to FIG. 16, the non-conductive materials NCM' have fluidity FL1 toward the conductive materials CM' by a reduction in the thickness thereof, and the conductive materials CM' may have fluidity FL2 toward the non-conductive materials NCM' by a reduction in the thickness thereof. The fluidity (FL1 and FL2) may be as much as a reduction in the thickness. As the pressure applied to the non-conductive materials NCM' and the conductive materials CM' increases, the fluidity FL1 of the non-conductive materials NCM' and the fluidity FL2 of the conductive materials CM' may increase. The conductive materials CM' may contact the bumps BUMP, and the non-conductive materials NCM' may contact the substrate SUB. In response to downward pressure being applied, the pressure received by the conductive materials CM' may be higher than the pressure received by the non-conductive materials NCM' because the bump BUMP protrudes downwardly beyond the substrate SUB. Therefore, the fluidity FL2 of the conductive materials CM' may be greater than the fluidity FL1 of the non-conductive materials NCM', and thus, each of the conductive materials CM' may have outwardly convex side surfaces CMc, as illustrated in FIG. 16.

Figure 20:
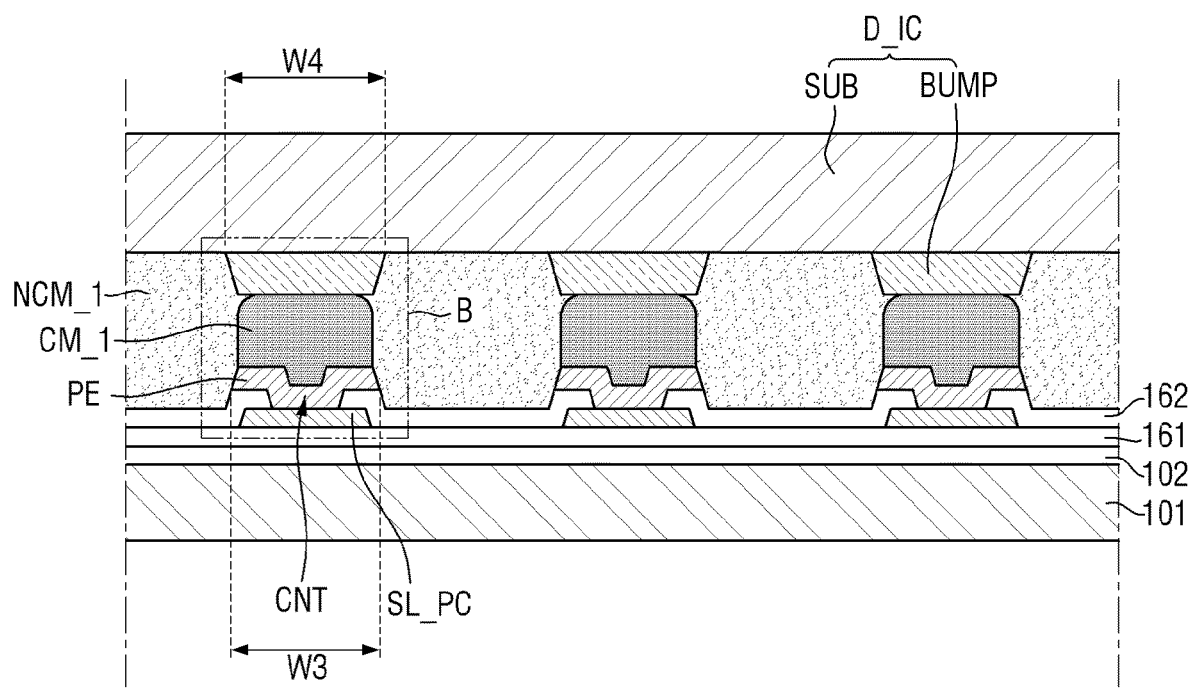
FIG. 20 is a schematic cross-sectional view of a display device according to another embodiment of the disclosure.
Figure 21:
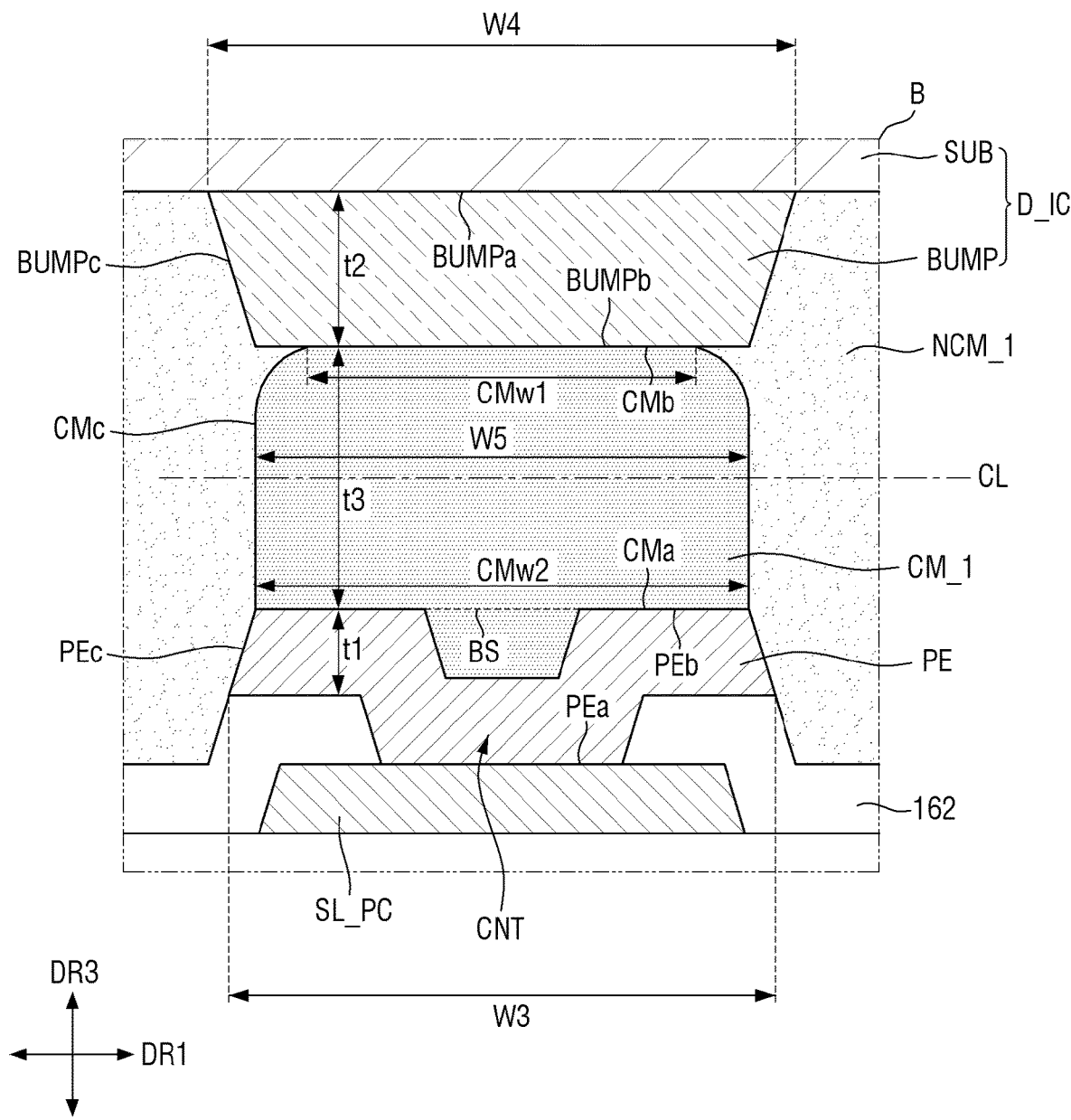
FIG. 21 is a schematic enlarged cross-sectional view of an area B of FIG. 20.

FIG. 20 is a schematic cross-sectional view of a display device according to another embodiment. FIG. 21 is a schematic enlarged cross-sectional view of area B of FIG. 20.

Referring to FIGS. 20 and 21, the display device of FIGS. 20 and 21 differs from the display device of FIGS. 5 and 6 at least in the arrangement and shape of conductive members CM_1 and the arrangement and shape of non-conductive members NCM_1.

In case that bottom surfaces BUMPb of bumps BUMP and top surfaces PEb of pad electrodes PE have the same width in a plan view, the length of the overlapping areas of the conductive members CM_1 and the bottom surfaces BUMPb of the bumps BUMP in a first direction DR1 may differ from the length of the overlapping areas of the conductive members CM_1 and the top surfaces PEb of the pad electrodes PE in the first direction DR1. The length of the overlapping areas of the conductive members CM_1 and the top surfaces PEb of the pad electrodes PE in the first direction DR1 may be greater than the length of the overlapping areas of the conductive members CM_1 and the bottom surfaces BUMPb of the bumps BUMP in the first direction DR1. The length of the contact areas of the conductive members CM_1 and the top surfaces PEb of the pad electrodes PE in the first direction DR1 may be greater than the length of the contact areas of the conductive members CM_1 and the bottom surfaces BUMPb of the bumps BUMP in the first direction DR1, and a length CMw1 of parts of the top surfaces of the conductive members CM_1 contacting the bottom surfaces BUMPb of the bumps BUMP may be smaller than a length CMw2 of parts of the bottom surfaces of the conductive members CM_1 contacting reference planes BS of the pad electrodes PE.

The top surfaces of the conductive members CM_1 may contact the center part of the bottom surfaces BUMPb of the bumps BUMP and may expose outer parts of the bottom surfaces BUMPb of the bumps BUMP adjacent to side surfaces BUMPc of the bumps BUMP. The non-conductive members NCM_1 may be disposed between the conductive members CM_1 and the outer parts of the bottom surfaces BUMPb of the bumps BUMP and may directly contact the outer parts of the bottom surfaces BUMPb of the bumps BUMP.

The shape of the conductive members CM_1 may originate from how the conductive members CM_1 are formed, which will be described below with reference to FIGS. 22 and 23.

The conductive members CM_1 may be asymmetrical with respect to the reference line CL that equally divide the conductive members CM_1 in a thickness direction, between the reference planes BS of the pad electrodes PE and the bottom surfaces BUMPb of the bumps BUMP.

Figure 22:
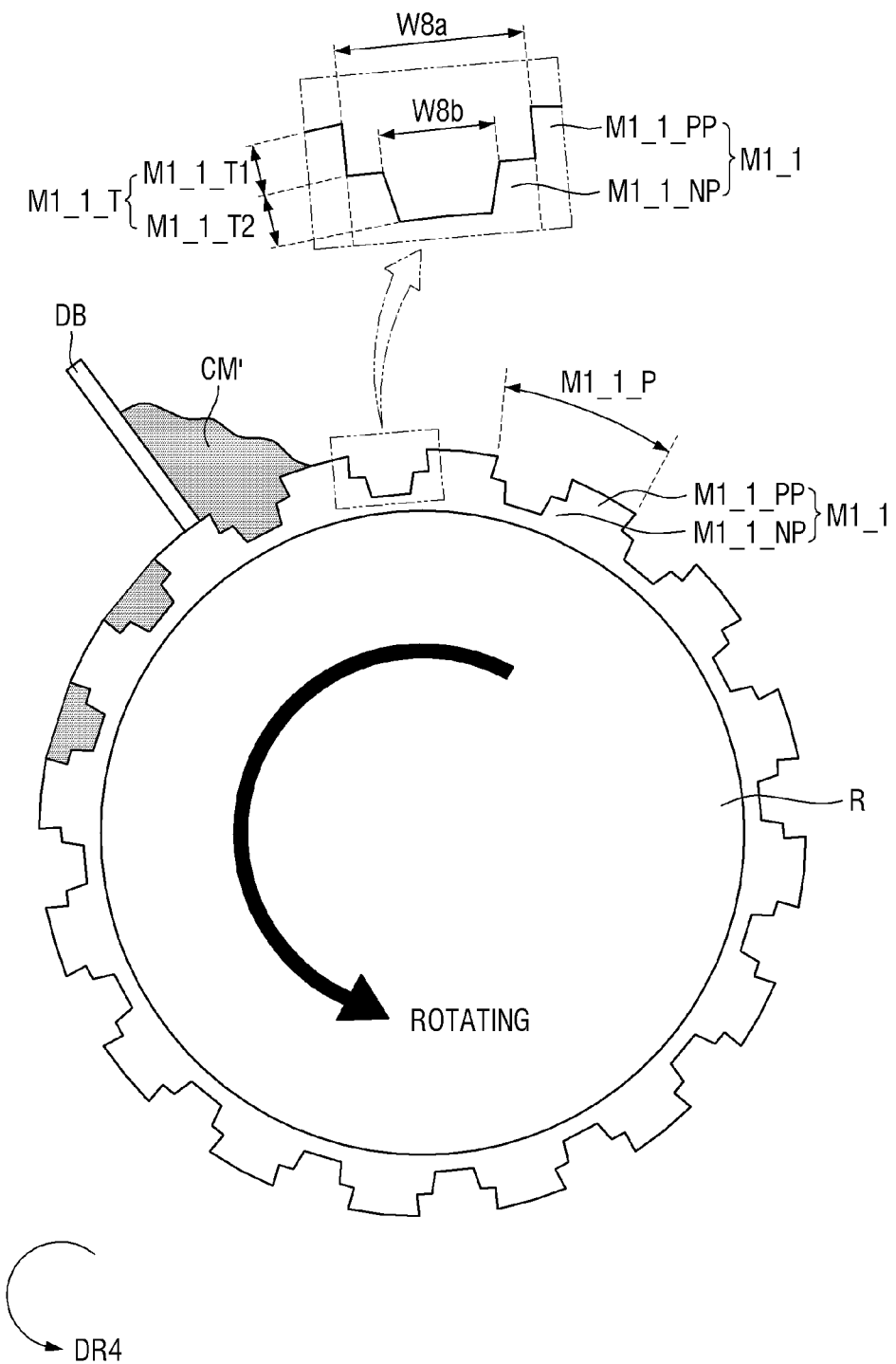

FIGS. 22 and 23 are schematic cross-sectional views illustrating a method of manufacturing a display device according to another embodiment.

The embodiment of FIGS. 22 and 23 differs from the embodiment(s) of FIGS. 8 through 16 at least in that conductive materials CM' are disposed on second electrodes, which are disposed on a second substrate to be spaced apart from one another, rather than in areas that overlap first electrodes. Here, the second substrate may be a substrate SUB, and the second electrodes may be bumps BUMP.

The conductive materials CM' may be formed by gravure printing. The structure and functions of a gravure printing device for forming the conductive materials CM' are as already described above with reference to FIG. 9, and thus, detailed descriptions thereof will be omitted.

Similar to the non-conductive materials NCM' of FIG. 9, depressed parts M1_1_NP of a first mold M1_1 may be filled with the conductive materials CM'. The first mold M1_1 may include at least one of the aforementioned materials of the first mold M1 of FIG. 9. In this case, the descriptions of changes in length of the first mold M1 of FIG. 9 in case that the first mold M1 is unfolded and in case that the first mold M1 is connected to the rotating part R may be directly applicable to the first mold M1_1.

Referring to FIG. 22, each of the depressed parts M1_1_NP may include a first portion, which is located at the center of the corresponding depressed part M1_1_NP and has a smallest surface height, and second portions, which are disposed between the first portion and neighboring embossed parts M1_1_PP. The surface height of the second portions may be greater than that of the first portion and smaller than that of embossed parts M1_1_PP.

The shape of the conductive material CM' filled into the depressed parts M1_1_NP may be identical to the shape of the structure depressed in a thickness direction from the reference plane of the depressed parts M1_1_NP (i.e., the surfaces of the neighboring embossed parts M1_1_PP).

A width W8b of the first portion of each of the depressed parts M1_1_NP may be smaller than a width W8a of each of the depressed parts M1_1_NP. Referring to FIG. 23, the width W8b may be equal to the width of parts of conductive materials CM'_1 that protrude in a third direction DR3, and the width W8a may be equal to the maximum width of the conductive materials CM'_1. The width, in the first direction DR1, of the parts of the conductive materials CM'_1 that protrude in the third direction DR3 may be the smaller than the maximum width of the conductive materials CM'_1. The conductive materials CM'_1, which are disposed on the bumps BUMP, may contact pad electrodes PE, as illustrated in FIG. 16, may be attached to the pad electrodes PE by heat and pressure applied thereto from a surface of a driving member D_IC that does not face the bumps BUMP on the substrate SUB, and may thereby electrically connect the pad electrodes PE and the bumps BUMP. As the contact areas of the conductive materials CM'_1 and the pad electrodes PE decrease, the adhesion of the conductive materials CM'_1 to the pad electrodes PE may increase. In the embodiment(s) of FIGS. 22 and 23, the adhesion of the conductive materials CM'_1 to the pad electrodes PE may be improved by forming the conductive materials CM'_1 such that the width, in the first direction DR1, of the parts of the conductive materials CM'_1 that protrude in the third direction DR3 is the smaller than the maximum width of the conductive materials CM'_1. However, since the contact areas of the conductive materials CM'_1 and the pad electrodes PE are inversely proportional to the electrical resistances between the pad electrodes PE, the conductive materials CM'_1, and the bumps BUMP, the electrical resistances between the pad electrodes PE, the conductive materials CM'_1, and the bumps BUMP may be sufficiently reduced, if the width, in the first direction DR1, of the parts of the conductive materials CM'_1 that are projected in the third direction DR3 are about 80% to about 90% of the maximum width of the conductive materials CM'_1 so that sufficient contact areas may be secured between the conductive materials CM'_1 and the pad electrodes PE.

A thickness M1_1_T of the depressed parts M1_1_NP may be equal to the thickness of the conductive materials CM'_1 of FIG. 23. The thickness M1_1_T may include a first thickness M1_1_T1, which corresponds to the thickness of the second portion of each of the depressed parts M1_1_NP, and a second thickness M1_1_T2, which corresponds to the thickness of the first portion of each of the depressed parts M1_1_NP. The second thickness M1_1_T2 (i.e., the thickness of the parts of the conductive materials CM'_1 that protrude in the third direction DR3) may be about 5% to about 30% of the first thickness M1_1_T1 (i.e., the surface height of the parts of the conductive materials CM'_1 that protrude in the third direction DR3). Specifically, if the second thickness M1_1_T2 (i.e., the thickness of the parts of the conductive materials CM'_1 that protrude in the third direction DR3) is about 5% or greater of the first thickness M1_1_T1 (i.e., the surface height of the parts of the conductive materials CM'_1 that protrude in the third direction DR3), the adhesion of the conductive materials CM'_1 to the pad electrodes PE may be improved, and if the second thickness M1_1_T2 (i.e., the thickness of the parts of the conductive materials CM'_1 that protrude in the third direction DR3) is about 30% or less of the first thickness M1_1_T1 (i.e., the surface height of the parts of the conductive materials CM'_1 that protrude in the third direction DR3), the pad electrodes PE may be prevented from not sufficiently contacting parts of the conductive materials CM'_1 except for the protruding parts of the conductive materials CM'_1 because of the thickness of the protruding parts of the conductive materials CM'_1.

Figure 24:
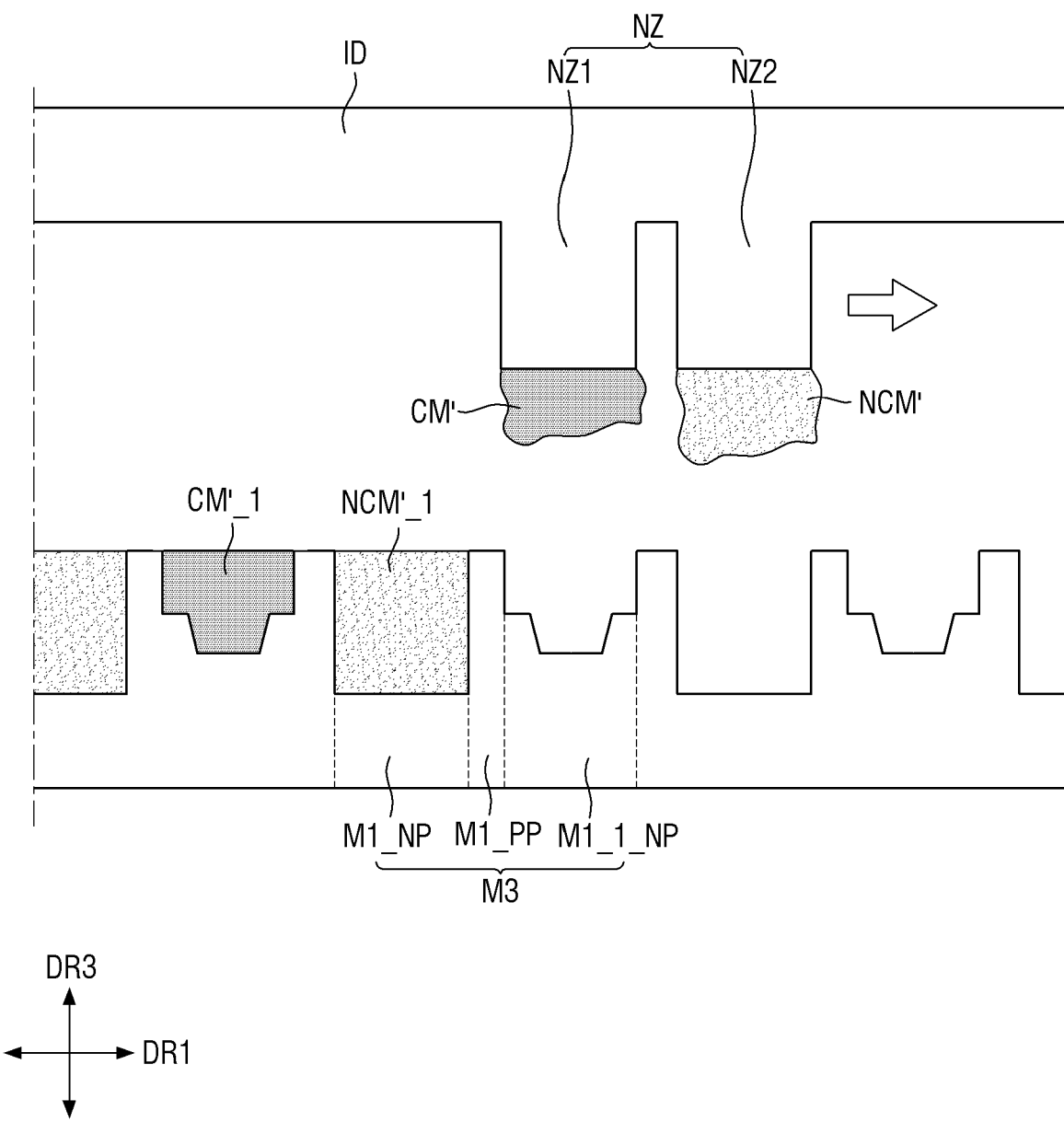

FIGS. 24 and 25 are schematic cross-sectional views illustrating a method of manufacturing a display device according to another embodiment.

In the embodiment(s) of FIGS. 24 and 25, non-conductive materials NCM' may be formed on a first substrate, on which first electrodes are disposed to be spaced apart from one another between the first electrodes, and conductive materials CM'_1 may be formed on the first electrodes. In contrast, in the embodiment(s) of FIGS. 8 through 16, the non-conductive materials NCM' may be formed on the first substrate, between the first electrodes (S10), and the conductive materials CM' may be formed in the areas that overlap the first electrodes (S20). Specifically, in the embodiment(s) of FIGS. 24 and 25, the non-conductive materials NCM' may be formed on the first substrate between the first electrodes; conductive materials CM'_1 are formed on the first electrodes; a second substrate including second electrodes may be placed above the first substrate; and the first electrodes and the second electrodes may be electrically connected by the conductive materials CM'_1. Here, the first substrate may be a substrate SUB, the first electrodes may be bumps BUMP, the second substrate may be a base substrate 101, and the second electrodes may be pad electrodes PE.

Referring to FIG. 24, the formation of non-conductive materials NCM'_1 on the substrate SUB, on which the bumps BUMP are disposed to be spaced apart from one another, between the bumps BUMP and the formation of conductive materials CM'_1 on the bumps BUMP may be performed by intaglio printing. First depressed parts M1_1_NP of a third mold M3 may have a shape identical to the depressed parts M1_1_NP of the first mold M1_1 of FIG. 22, and second depressed parts M1_NP of the third mold M3 may have a shape identical to the depressed parts M1_NP of the first mold M1 of FIG. 9. The formation of conductive materials CM' in the first depressed parts M1_1_NP of the third mold M3 and the formation of non-conductive materials NCM' in the second depressed parts M1_NP of the third mold M3 are as already described above with reference to FIGS. 9 and 22, and thus, detailed descriptions thereof will be omitted.

Thereafter, referring to FIG. 25, the conductive materials CM'_1 and the non-conductive materials NCM'_1 may be separated from the third mold M3, the conductive materials CM'_1 may be formed on the bumps BUMP, and the non-conductive materials NCM'_1 may be formed between the bumps BUMP.

Figure 26:
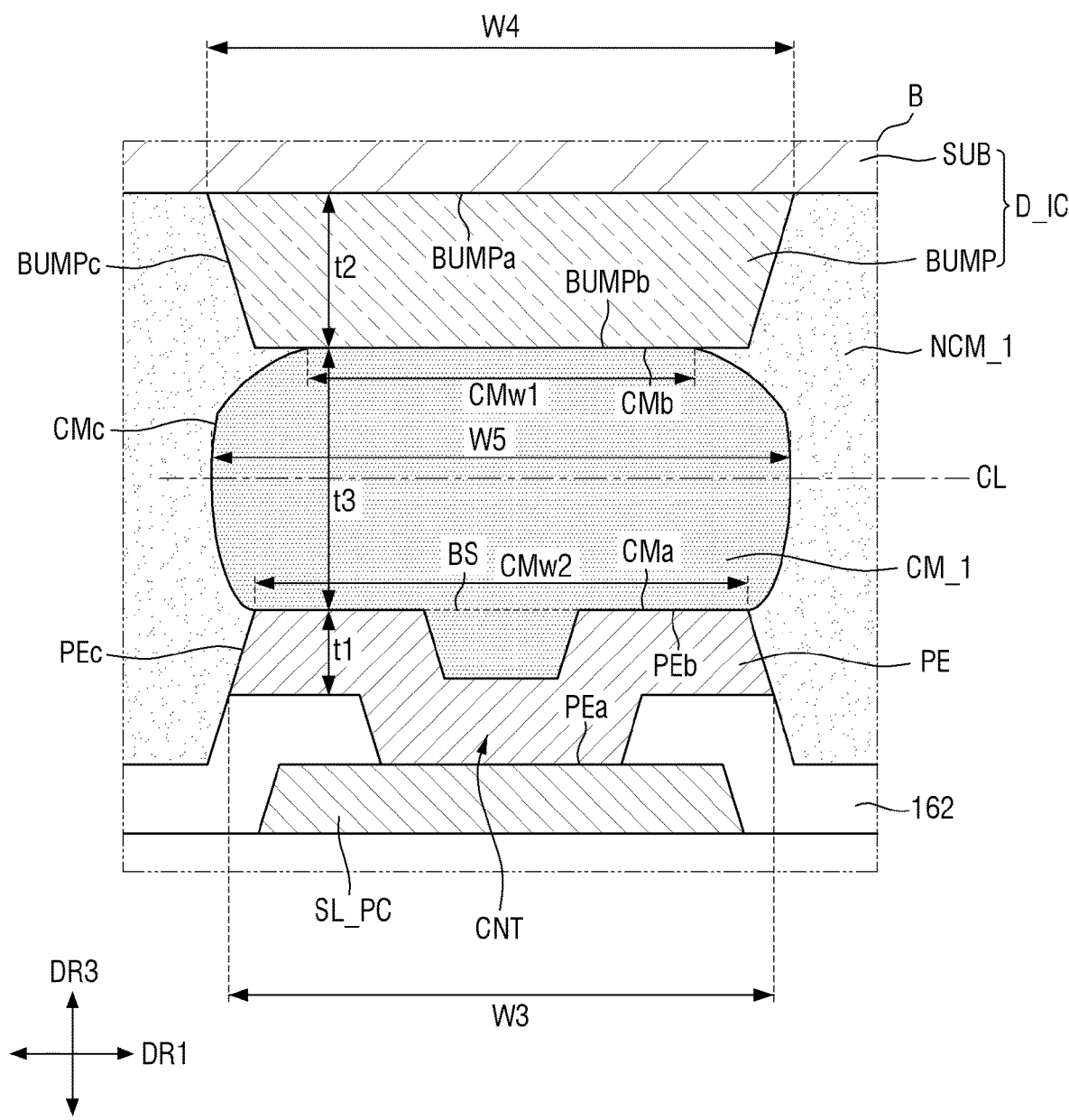
FIG. 26 is a schematic cross-sectional view of a display device according to another embodiment of the disclosure.

FIG. 26 is a schematic cross-sectional view of a display device according to another embodiment.

The embodiment of FIG. 26 differs from the embodiment of FIG. 21 at least in that side surfaces CMc of a conductive member CM_1 are outwardly convex from the center thereof, as illustrated in FIG. 19.

Referring to FIG. 26, the length, in a first direction DR1, of part of a conductive member CM_1 contacting a top surface PEb of a pad electrode PE may be greater than the length, in the first direction DR1, of part of the conductive member CM_1 contacting a bottom surface BUMPb of a bump BUMP and may be smaller than a width W5 of the conductive member CM_1 along a reference line CL.

For example, a length CMw2 of part of the bottom surface of the conductive member CM_1 contacting a reference plane BS of the pad electrode PE may be greater than a length CMw1 of part of the top surface of the conductive member CM_1 contacting the bottom surface BUMPb of the bump BUMP and may be smaller than the width W5 of the conductive member CM_1 along the reference line CL.

Figure 27:
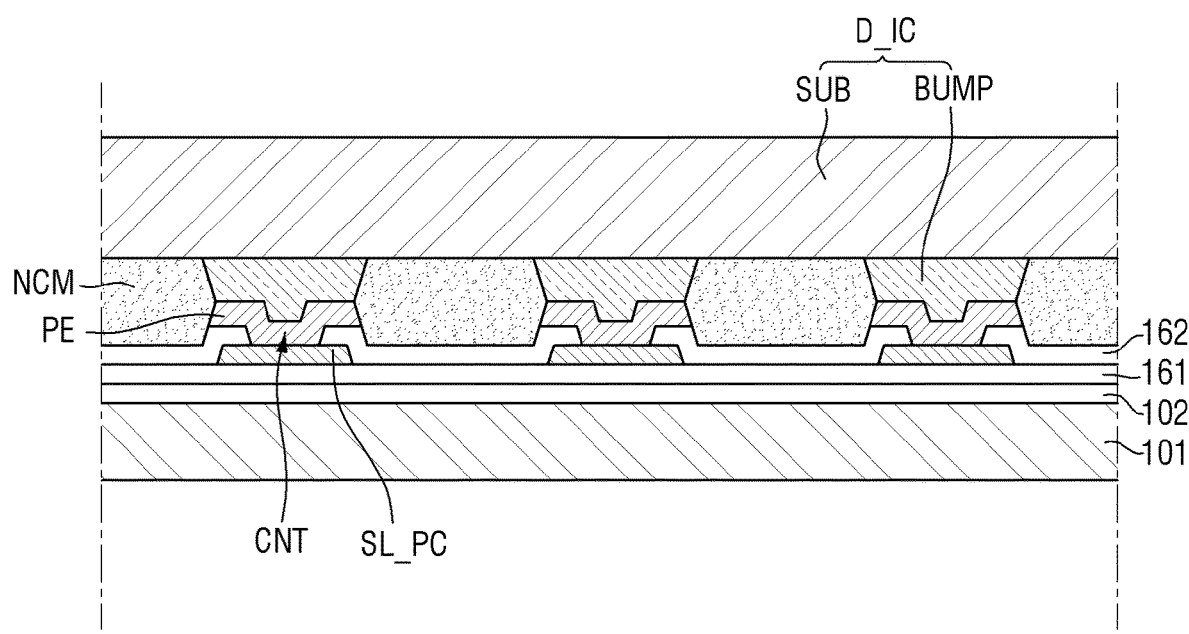
FIG. 27 is a schematic cross-sectional view of a display device according to another embodiment of the disclosure.

FIG. 27 is a schematic cross-sectional view of a display device according to another embodiment.

The embodiment of FIG. 27 differs from the embodiment of FIG. 5 in that bumps BUMP and pad electrodes PE are directly connected.

Referring to FIG. 27, the bumps BUMP and the pad electrodes PE may be directly connected without the aid of the conductive members CM of FIG. 5. The bumps BUMP and the pad electrodes PE may be connected by ultrasonic bonding. The bottom surfaces of the bumps BUMP may be directly bonded to the top surfaces of the pad electrodes PE.

FIGS. 28 through 32 are schematic cross-sectional views illustrating a method of manufacturing a display device according to another embodiment.

The embodiment(s) of FIGS. 28 through 32 differs from the embodiment(s) of FIGS. 8 through 16 in that in step S20, non-conductive materials NCM' are formed between second electrodes, instead of forming conductive materials in areas that overlap first electrodes, and that in step S30, a first substrate including the first electrodes is placed above a second substrate including the second electrodes and the first electrodes and the second electrodes are directly connected, instead of placing the second substrate above the first substrate and electrically connecting the first electrodes and the second electrodes by conductive materials. Here, the first substrate may be a substrate SUB, the first electrodes may be bumps BUMP, the second substrate may be a base substrate 101, and the second electrodes may be pad electrodes PE.

Figure 28:
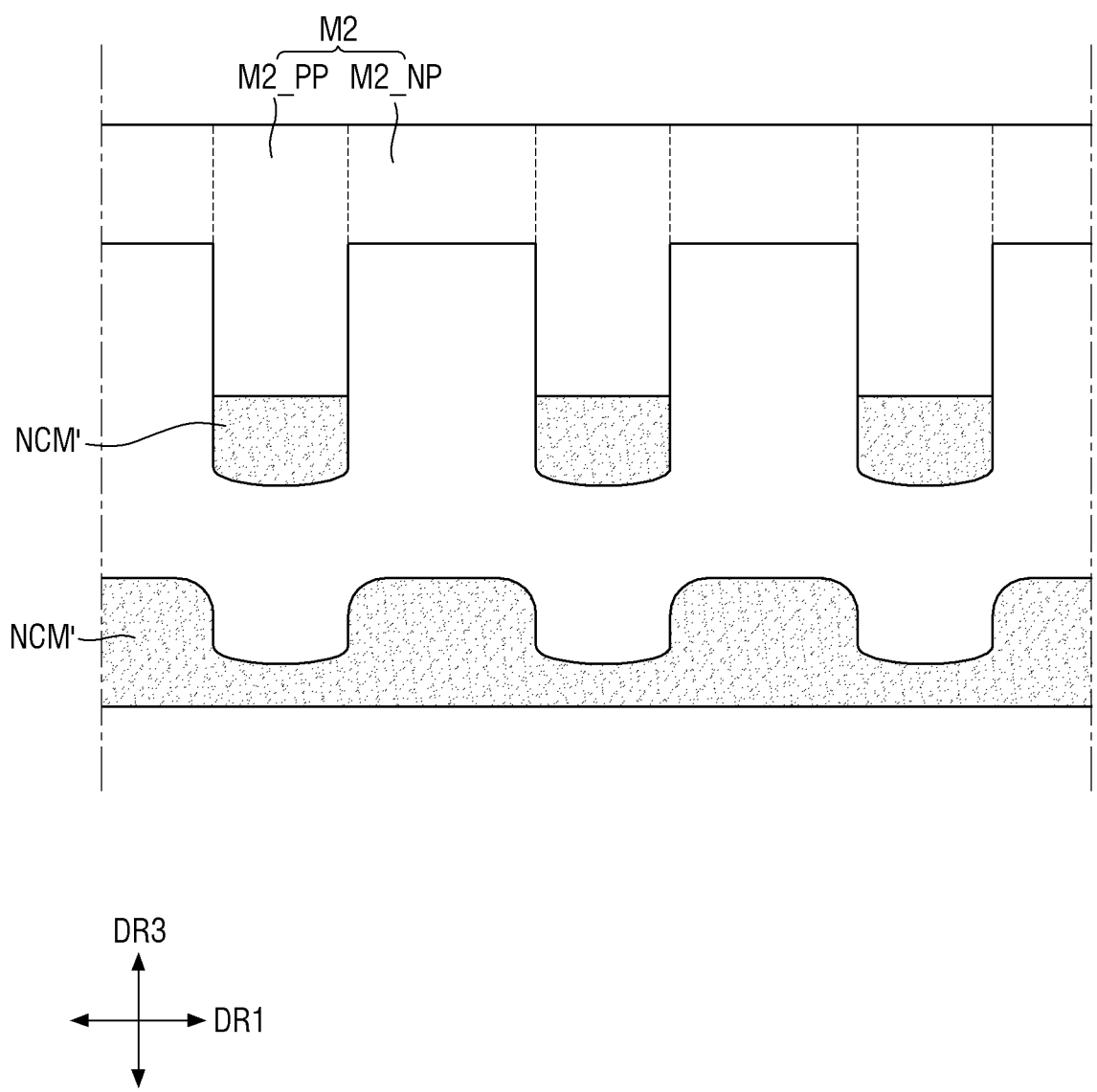
Figure 29:
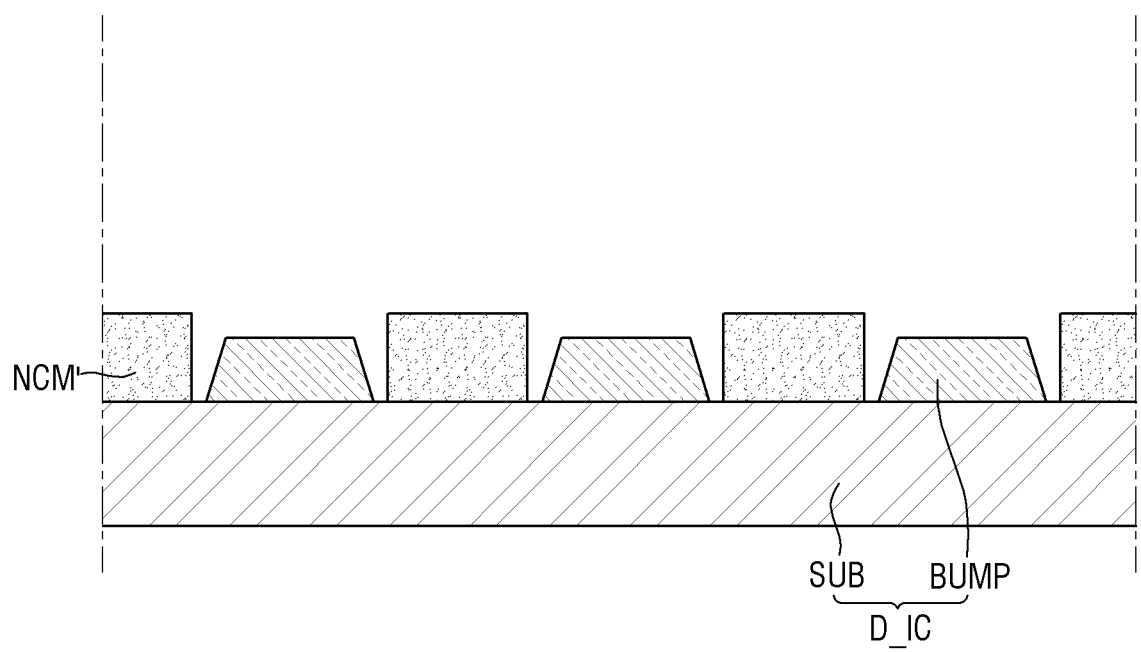

FIGS. 28 and 29 illustrate how to form the non-conductive materials NCM' between bumps BUMP on the substrate SUB. The non-conductive materials NCM' may be formed by embossed printing using the second mold M2 of FIGS. 12 and 13. Embossed printing is as already described above with reference to FIGS. 12 and 13, and thus, detailed descriptions thereof will be omitted.

Figure 30:
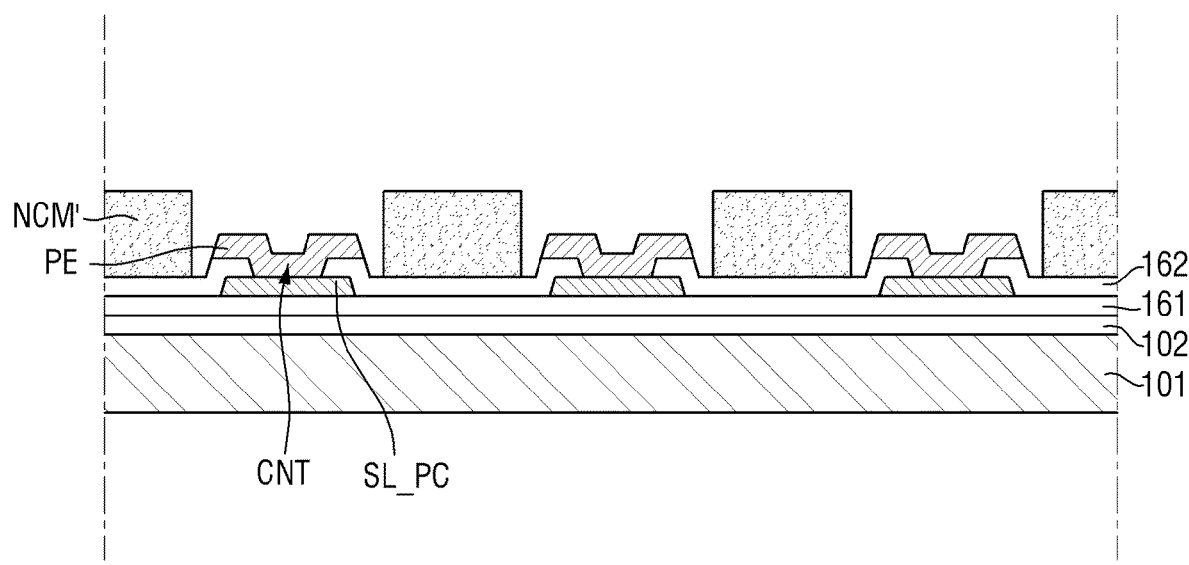

Thereafter, referring to FIG. 30, non-conductive materials NCM' may be formed between pad electrodes PE on the base substrate 101. The formation of the non-conductive materials NCM' between the bumps BUMP on the substrate SUB and the formation of the non-conductive materials NCM' between the pad electrodes PE on the base substrate 101 may be performed in reverse order. Similar to the formation of the non-conductive materials NCM' between the bumps BUMP, the formation of the non-conductive materials NCM' between the pad electrodes PE may be performed by embossed printing using the second mold M2.

Figure 31:
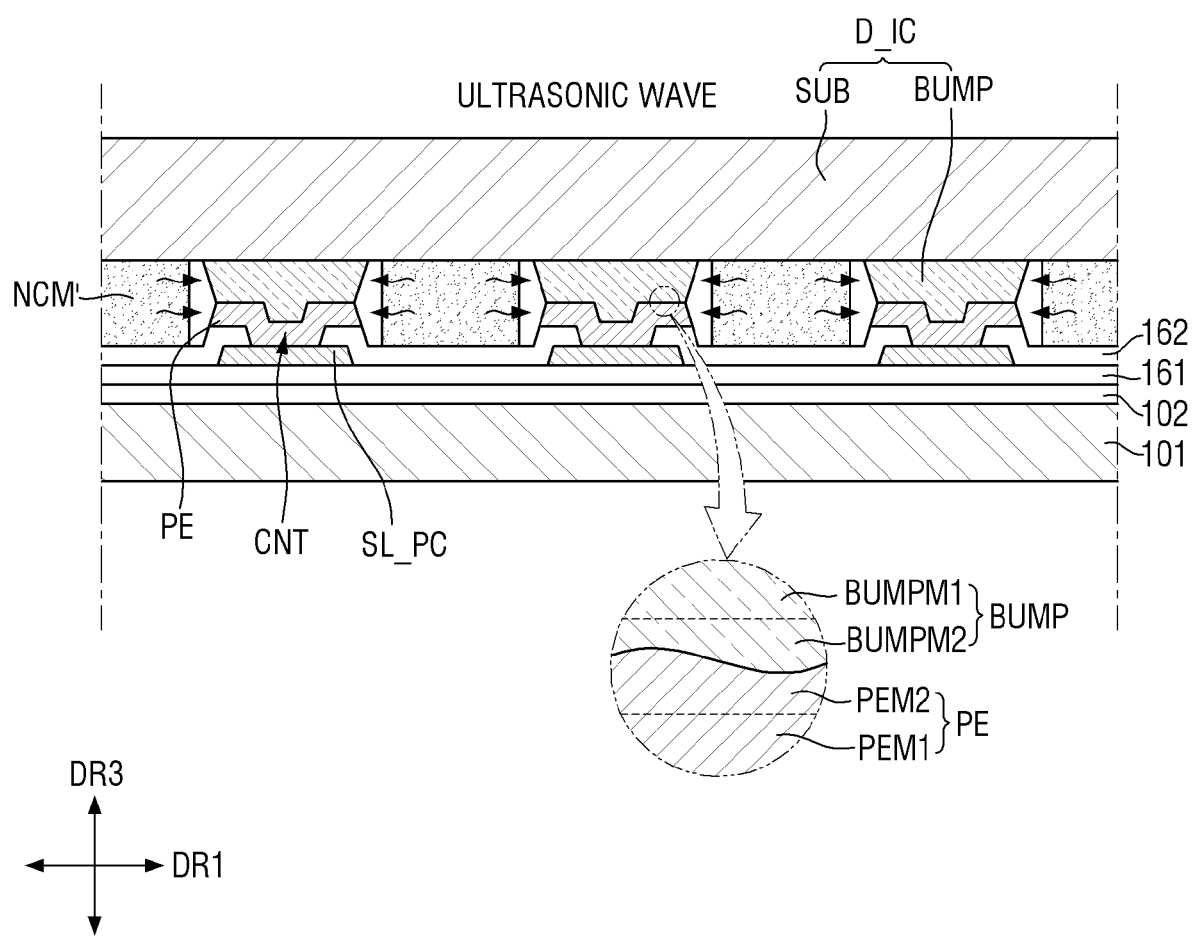

Thereafter, referring to FIGS. 31 and 32, the substrate SUB may be placed above the base substrate 101, and the pad electrodes PE and the bumps BUMP may be directly connected. The pad electrodes PE and the bumps BUMP may be directly connected by ultrasonic bonding. Specifically, an ultrasonic device may be placed above a driving member D_IC, and ultrasonic waves generated by the ultrasonic device may be transmitted to the bumps BUMP as vibration waves so that frictional heat is generated at the interfaces between the bumps BUMP and the pad electrodes PE in accordance with the frequency and the amplitude of the vibration waves. Because of the friction heat, the bumps BUMP and the pad electrodes are directly connected by diffusion at the interfaces therebetween. As is clear from an enlarged view of FIG. 31, each of the bumps BUMP may include a portion BUMPM1 that consists only of the material of the bumps BUMP and a portion BUMPM2 that consists of both the material of the bumps BUMP and the material of the pad electrodes PE, and similarly, each of the pad electrodes PE may include a portion PEM1 that consists only of the material of the pad electrodes PE and a portion PEM2 that consists of both the material of the pad electrodes PE and the material of the bumps BUMP.

The vibration direction of the bumps BUMP may be a second direction DR2, as illustrated in FIG. 32. In addition to the vibration of the bumps BUMP, heat and pressure may be provided from above the driving member D_IC, as already described above with reference to FIG. 16. Because of the frictional heat from the vibration of the bumps BUMP and the heat and pressure provided from above the driving member D_IC, the non-conductive materials NCM' on the substrate SUB and the non-conductive materials NCM' on the base substrate 101 may flow toward the pad electrodes PE or the bumps BUMP to fill the gaps between the non-conductive materials NCM' and the pad electrodes PE and the bumps BUMP. The non-conductive materials NCM' filling the gaps may directly contact the pad electrodes PE and the bumps BUMP.

Although embodiments of the disclosure have been disclosed for illustrative purposes, those skilled in the art will appreciate that various modifications, additions and substitutions are possible, without departing from the scope and spirit of the disclosure as disclosed in the accompanying claims.

What is claimed is:
1. A display device comprising:
a substrate;
a plurality of pad electrodes disposed on the substrate and spaced apart from one another;
a driving member including a plurality of bumps, which overlap the plurality of pad electrodes in a thickness direction of the substrate and are spaced apart from one another;
conductive members disposed between the plurality of pad electrodes and the plurality of bumps, which overlap the plurality of pad electrodes, to electrically connect the plurality of pad electrodes and the plurality of bumps; and
non-conductive members disposed adjacent to the plurality of pad electrodes, the plurality of bumps, and the conductive members, wherein the conductive members and the non-conductive members include different materials, each of the conductive members includes a first side surface that faces a corresponding one of the non-conductive members, each of the non-conductive members includes a second side surface that faces a corresponding one of the conductive members, and a part of the first side surface and a part of the second side surface directly contact one another.

2. The display device of claim 1, wherein a part of the first side surface and a part of the second side surface are spaced apart by an air gap.

3. The display device of claim 1, wherein the conductive members are spaced apart from one another in a direction in which the plurality of pad electrodes are arranged.

4. The display device of claim 3, wherein the conductive members directly contact bottom surfaces of the plurality of bumps and top surfaces of the plurality of pad electrodes, a width of each of the plurality of pad electrodes is equal to a width of each of the plurality of bumps, and in a plan view, a length of a part of each of the conductive members contacting a corresponding one of the top surfaces of the plurality of pad electrodes is equal to a length of a part of each of the conductive members contacting a corresponding one of the bottom surfaces of the plurality of bumps.

5. The display device of claim 4, wherein a width of each of the conductive members is equal to a width of each of the top surfaces of the plurality of pad electrodes and a width of each of the bottom surfaces of the plurality of bumps.

6. The display device of claim 4, wherein the non-conductive members do not contact the bottom surfaces of the plurality of bumps or the top surfaces of the plurality of pad electrodes.

7. The display device of claim 6, wherein each of the conductive members is symmetrical with respect to a reference line that equally divides a corresponding one of the conductive members in the thickness direction of the substrate, between a reference plane of each of the top surfaces of the plurality of pad electrodes and a reference plane of each of the bottom surfaces of the plurality of bumps.

8. The display device of claim 7, wherein the first side surfaces of the conductive members are outwardly convex, and a width, along the reference line, of each of the conductive members is greater than a length, in a plan view, of the part of the each of the conductive members contacting a corresponding one of the plurality of pad electrodes.

9. The display device of claim 3, wherein the conductive members directly contact the bottom surfaces of the plurality of bumps and the top surfaces of the plurality of pad electrodes, a width of each of the plurality of pad electrodes is equal to a width of each of the plurality of bumps, and in a plan view, a length of a part of each of the conductive members contacting a corresponding one of the top surfaces of the plurality of pad electrodes is greater than a length of a part of each of the conductive members contacting a corresponding one of the bottom surfaces of the plurality of bumps.

10. The display device of claim 9, wherein the conductive members are asymmetrical with respect to a reference line that equally divides a corresponding one of the conductive members in the thickness direction of the substrate, between a reference plane of each of the top surfaces of the plurality of pad electrodes and a reference plane of each of the bottom surfaces of the plurality of bumps.

11. The display device of claim 9, wherein the conductive members expose parts of the bottom surfaces of the plurality of bumps, and the non-conductive members directly contact the exposed parts of the bottom surfaces of the plurality of bumps.

12. The display device of claim 3, wherein each of the conductive members includes a conductive paste, and each of the non-conductive members includes an insulating resin.

13. The display device of claim 3, further comprising:

pad contact parts disposed under the plurality of pad electrodes; and an interlayer insulating layer disposed between each of the pad contact parts and each of the plurality of pad electrodes, the interlayer insulating layer including contact holes, wherein each of the contact holes exposes a part of a corresponding one of top surfaces of the pad contact parts, and the plurality of pad electrodes are electrically connected to the pad contact parts through the contact holes.

14. The display device of claim 13, wherein a width of each of the plurality of pad electrodes is greater than a width of each of the pad contact parts.

15. The display device of claim 13, wherein the driving member includes a driving chip or a printed circuit film, and the plurality of pad electrodes receive driving signals from the driving member and transmit the driving signals to the pad contact parts.

16. The display device of claim 13, wherein each of the non-conductive members directly contacts a top surface of the interlayer insulating layer.

* * * * *